(12) United States Patent
Woodard et al.

(10) Patent No.: US 7,027,942 B1
(45) Date of Patent: Apr. 11, 2006

(54) MULTIRATE SPECTRAL ANALYZER WITH ADJUSTABLE TIME-FREQUENCY RESOLUTION

(75) Inventors: Jeffrey Woodard, Reston, VA (US); Joseph Creekmore, Reston, VA (US)

(73) Assignee: The Mitre Corporation, McLean, VA (US)

( * ) Notice: Subject to any disclaimer, the term of this patent is extended or adjusted under 35 U.S.C. 154(b) by 0 days.

(21) Appl. No.: 10/972,461

(22) Filed: Oct. 26, 2004

(51) Int. Cl.
*G06F 19/00* (2006.01)

(52) U.S. Cl. ...................................... 702/76; 324/76.19
(58) Field of Classification Search ................... 702/76, 702/182, 189; 324/76.19, 76.22
See application file for complete search history.

(56) References Cited

U.S. PATENT DOCUMENTS

| | | | |
|---|---|---|---|
| 4,131,766 A | 12/1978 | Narasimha | |
| 4,799,179 A * | 1/1989 | Masson et al. | 708/313 |
| 4,866,777 A | 9/1989 | Mulla et al. | |
| 4,959,863 A | 9/1990 | Azuma et al. | |
| 5,168,214 A | 12/1992 | Engeler et al. | |
| 5,323,391 A | 6/1994 | Harrison | |
| 5,436,940 A | 7/1995 | Nguyen | |
| 5,587,998 A * | 12/1996 | Velardo et al. | 370/289 |
| 5,606,575 A | 2/1997 | Williams | |
| 5,757,867 A | 5/1998 | Caulfield et al. | |
| 5,926,455 A | 7/1999 | Allpress | |
| 5,982,832 A | 11/1999 | Ko | |
| 6,005,900 A | 12/1999 | Zangi | |
| 6,085,077 A | 7/2000 | Fields et al. | |
| 6,236,731 B1 | 5/2001 | Brennan et al. | |
| 6,298,361 B1 | 10/2001 | Suzuki | |
| 6,442,506 B1 * | 8/2002 | Trevino | 702/185 |

(Continued)

OTHER PUBLICATIONS

J. Woodard, et al., "Multirate spectral analysis for passive sonar", Integrated Computer-Aided Engineering, IOS Press, vol. 10, No. 1, 2003, pp. 91-108.

(Continued)

*Primary Examiner*—Edward Raymond
(74) *Attorney, Agent, or Firm*—Rosenberg, Klein & Lee

(57) ABSTRACT

A multirate spectral analyzer receives a data sequence through a tapped delay line (510) onto a plurality of filter channels, each of which includes a first decimator (520), a polyphase filter (530), and a second decimator (540). Each filter channel is coupled to a transform processor (550) which modulates the frequency response of the polyphase filters to a plurality of identical bandpass filters spaced evenly at $2\pi k/M$ intervals, where $k=1, 2, \ldots, M-1$, and M is the number of filter channels. The transform processor (550) outputs a plurality of time series representative of the frequency component for each of the corresponding filter channels. By choosing a prototype filter order to be much larger than the number of filter channels, the effects of aliasing in the output are greatly reduced. The reduction in aliasing further allows, by prudent selection of the two decimators, for fractional temporal overlap to be implemented in the spectral estimates.

20 Claims, 20 Drawing Sheets

U.S. PATENT DOCUMENTS

| | | | |
|---|---|---|---|
| 6,542,094 B1 | 4/2003 | Venkitachalam et al. | |
| 2002/0156820 A1 | 10/2002 | Kishi | |
| 2002/0198913 A1 | 12/2002 | Johnson | |
| 2003/0005007 A1* | 1/2003 | Neretti et al. | 708/300 |
| 2003/0005008 A1 | 1/2003 | Gray | |
| 2003/0016772 A1* | 1/2003 | Ekstrand | 375/350 |
| 2004/0039574 A1* | 2/2004 | Zelazo | 704/500 |
| 2004/0042557 A1* | 3/2004 | Kabel et al. | 375/260 |
| 2004/0267542 A1* | 12/2004 | Absar et al. | 704/500 |
| 2005/0018796 A1* | 1/2005 | Sande et al. | 375/350 |
| 2005/0108002 A1* | 5/2005 | Nagai et al. | 704/203 |

OTHER PUBLICATIONS

A. Tkacenko, et al., "Sinusoidal frequency estimation using filter banks" in Proc. IEEE Int. Conf. on Acoust., Speech, and Signal Process., Salt Lake City, May 2001, pp. 3089-3092.

O. Jahromi, et al., "Multirate Spectral Estimation", Proc. 2001 IEEE Pacific Rim Conference on Communications, Computers and Signals Processing (PACRIM 2001), Victoria, British Columbia, Aug. 2001, pp. 152-155.

* cited by examiner

MULTIRATE SPECTRAL ANALYZER WITH ADJUSTABLE TIME-FREQUENCY RESOLUTION

BACKGROUND OF THE INVENTION

1. Field of the Invention

The invention described herein is related to non-parametric spectral analysis of discrete time data. More specifically, the invention implements a spectrum analyzer using a polyphase filter bank derived from a high order prototype filter. The order of the prototype filter may be chosen so as to cede time resolution in favor of improved frequency resolution.

2. Description of the Prior Art

For many applications in which non-stationary signals are typically encountered, such as in sonar (an acronym for sound navigation and ranging), short-time spectral analysis is often used, i.e., analysis performed over relatively brief segments during which spectral properties are assumed stable. In sonar, as in other applications like general audio, when analytical models of the data are not well-understood, non-parametric analysis is utilized. Ubiquitous in non-parametric analysis is the Discrete Fourier Transformer (DFT), which is implemented efficiently by the Fast Fourier Transform. This efficiency has helped DFT-based techniques dominate sonar spectral analysis. Indeed, DFT-based approaches are, of course, also widely utilized in many other spectral analysis applications.

Filter banks can also serve as effective spectrum analyzers. The filter bank spectrum analyzer is most commonly discussed for constant sample rate, stationary spectral analysis, where each output of a bank of M complex, uniform, bandpass filters is integrated over time. However, the M outputs at each sample can also be considered estimates of the short-time spectrum, and thus filter banks can provide a non-stationary analyzer as required for sonar or audio signals.

Although DFT-based spectral analysis is most often viewed as a block processing operation, it is well-known that the DFT can also be mapped into a sample-by-sample, or stream-oriented filter bank framework. The filter bank structure falls under the general class of subband coding, i.e., a transformation of a time-domain sequence into frequency-domain subbands, where subsequent processing can be performed on each band output. Subband filter structures now dominate audio and image analysis-synthesis systems for four main reasons: (1) they can remove redundancy in the frequency domain by exploiting spectral structure; (2) sophisticated psychophysical models incorporated in the frequency domain can aid in quantization and bit allocation; (3) the structures can be very efficiently implemented with multirate techniques; and, (4) any aliasing caused by multirate techniques can be almost entirely eliminated when used in analysis-synthesis tandems.

Despite its popularity in coding applications, multirate subband structures have not been considered for use as general purpose spectrum analyzers. This is due in part to the fact that, in spectral analysis, filters should permit little aliasing, while audio coders are often designed to allow considerable aliasing, as in the M-channel, maximally-decimated, quadrature mirror filter bank, popular in audio encoding. In subsequent audio decoding, the aliasing is exactly eliminated in a process called perfect reconstruction.

However, in spectral analysis, unlike in coding, no decoding is performed so aliasing cannot be eliminated. Because multirate subband structures have rarely been considered outside the context of perfect reconstruction coding, failure to cancel aliasing has been the primary obstacle in such structures being utilized in general purpose spectral analysis. Furthermore, the redundancy removal and psychophysical advantages mentioned for coding systems are not relevant to stand-alone spectrum analyzers. Thus, as most of the advantages mentioned previously no longer hold, the utility of multirate subband structures as stand-alone spectrum analyzers has not been widely recognized. An exception to this is the work of Tkacenko and Vaidyanathan in the Journal Paper, *Sinusoidal Frequency Estimation Using Filter Banks* (Proceedings of ICASSP, Vol. 5, 2001, pp. 3089–3092), where a multirate filter bank spectrum analyzer was used to estimate the frequency of a stationary sinusoid in noise. However, the spectrum analyzer of Tkacenko and Vaidyanathan utilizes a staionary, parametric model and, thus, its use in general purpose spectral analysis is extremely limited.

U.S. Pat. No. 6,085,077 to Fields, et al., discloses a digital channelized receiver using a uniform filter bank of polyphase bandpass filters. The disclosed receiver is adapted to acquire an instantaneous frequency measurement through assigning a predetermined relationship between each filter's frequency response, the decimation rate of the data on each filter channel, and the number of filters in the receiver. However, as the design of the disclosed filter bank is set by goals of hardware efficiency, effects of aliasing on the signal are overlooked. The effects of aliasing decreases the signal-to-noise ratio, which is especially problematic near the passband edges, as disclosed in the Specification of the reference. In obtaining an instantaneous frequency measurement, the disclosed invention requires additional circuitry at the output of the filter bank.

The mitigation of aliasing has been addressed by the inventors of the present invention and is discussed in their journal paper, "Multirate Spectral Analysis for Passive Sonar", (*Integrated Computer-Aided Engineering*, Vol. 10, No. 1, 2003, pp. 91–108). The inventors found that increasing the order of the prototype filter used to obtain polyphase components by a significant degree so as to approach an ideal low-pass filter greatly overcomes aliasing caused by decimation. In so doing, however, a sacrifice in temporal localization must be tolerated. Thus, relief from aliasing in this manner may not be acceptable in certain applications, including that described in U.S. Pat. No. 6,085,077, which requires an instantaneous measurement. Thus, the system disclosed by the above-referenced U.S. patent requires additional system components to obtain the instantaneous frequency measurement through the aliasing.

One of the shortcomings of filter bank spectral analyzers of the prior art, including the system disclosed by the above-referenced U.S. patent and the present inventor's own work, is that the temporal overlap used in the spectral estimation is confined to integer values equal to the ratio of the number of filters to the decimation factor on each channel. In many applications, this limitation reduces the ability for system optimization by, for example, requiring additional time to obtain spectra that may have more overlap than required or decreasing the accuracy in the spectral estimate by not having enough overlap in the temporal data stream.

In view of the shortcomings of the prior art, there is an apparent need for a general purpose spectral analysis tool having a greater degree of freedom in the selection of overlap in the temporal data for spectral estimation that affords, where allowable, a trade-off in temporal resolution in favor of improved spectral resolution.

SUMMARY OF THE INVENTION

The present invention implements a high order prototype filter from which polyphase bandpass filters are derived to mitigate the effects of aliasing in the frequency domain. Additionally, the present invention allows greater flexibility in the selection of temporal overlap in the computation of the spectral estimates.

The present invention provides a system for spectral analysis comprising a filter bank for filtering a plurality of decimated data sequences, wherein the filter bank is constructed in accordance with a polyphase decomposition of a prototype filter of an order greater than the number of filters in the filter bank. The prototype filter may, in certain embodiments, be a lowpass filter operational as a baseband filter in the filter bank. The system further comprises decimation means for decimating an input data sequence to provide the decimated data sequences on which the filter bank means is applied. The number of samples selected for the decimation means corresponds to a fractional number of the filters in the filter bank, where the fractional number is a rational number less than or equal to unity. The system further includes transform means for modulating the frequency response of the filter bank to produce a filter system having a frequency response equivalent to that of a plurality of shifted versions of the baseband filter's response.

In one aspect of the present invention, the spectral analysis system includes a tap delay line for receiving a time indexed data stream and providing a plurality of corresponding delay data sequences, a filter bank having a plurality of filter channels, where each filter channel includes a first decimator coupled to an output port of the tap delay line, a filter coupled to the first decimator, where the filter is of an order greater than the number of filters in the filter channel, and a second decimator coupled to the filter for producing a second decimated data sequence. The system further includes a transform processor coupled to the filter bank for transforming the frequency response of the filter bank to the frequency response of a plurality of bandpass filters, and a plurality of output channels, each producing a time-index sequence corresponding to one of the frequency components of the time-indexed input stream.

In certain other aspects of the present invention, the second decimator may be coupled to the transform processor at the output channel.

DETAILED DESCRIPTION OF THE PREFERRED EMBODIMENTS

Figure 1A:
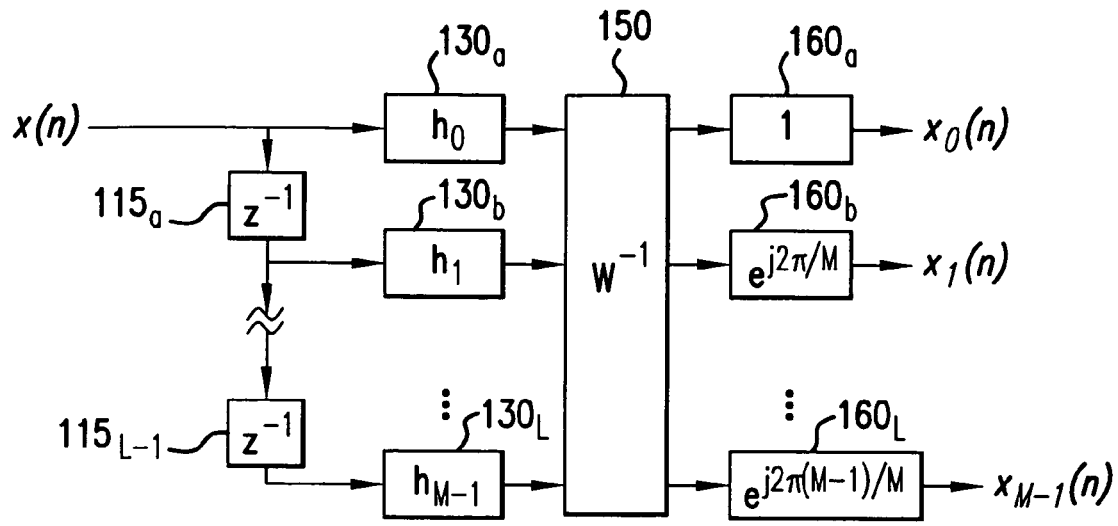
FIG. 1A is a block diagram illustrating a uniform DFT filter bank of the prior art.

FIG. 1A illustrates a uniform DFT filter bank as is known in the art. The DFT filter bank is composed of a tapped delay line formed of delay elements $115_a$–$115_{L-1}$, multipliers $130_a$–$130_L$, transform processor 150 and phase compensators $160_a$–$160_L$. The matrix W in transform processor 150 is the DFT matrix, $W(m,k)=W_M^{mk}$, and where $W_M=e^{-j(2\pi/M)}$ and $0 \leq m,k \leq M-1$. The entire structure is exactly equivalent to a conventional, M-point, block-oriented DFT with an overlap of M−1 samples. Note that an inverse DFT matrix, $W^{-1}$, as well as additional phase factors $e^{j(2\pi k/M)}$ are required because the delay chain, in effect, reverses the order of the input samples.

The transfer function of the baseband FIR filter is defined as:

$$H_0(z) = \sum_{k=0}^{N} h_k z^{-k} = \sum_{k=0}^{M-1} h_k z^{-k}. \tag{1}$$

For the DFT, the baseband filter order N=M−1 by definition as indicated in Eq. (1). It will be assumed that:

$$h(k)=h_{LP}(k)w(k), k=0, 1, \ldots, N, \tag{2}$$

and that a normalization is performed so that $\Sigma_{n=0}^N h_k=1$. The window function w(k) defines any standard window or taper. For example, for a rectangular window, w(k)=1, and for a Hamming window w(k)=0.54−0.46 cos(2πk/N). Typically, for the DFT, $h_{LP}(k)=1$, so that the scalars h(k) equal the window values. However, in the generalization discussed below, where N>M−1, $h_{LP}(k)$ will be defined as an ideal lowpass filter.

The bandpass filters $H_k(z)$ are defined by:

$$H_k(z)=H_0(zW_M^k), k=1, 2, \ldots, M-1. \tag{3}$$

Using the definition of $W_M$, the corresponding frequency responses become:

$$H_k(e^{j\omega})=H_0(e^{j(\omega-2\pi k/M)}), k=1, 2, \ldots, M-1. \tag{4}$$

Each complex bandpass filter $130_a$–$130_L$ is then one whose frequency response is just a shifted version of the baseband filter's response, so that such filter banks are called uniform. It has been shown that each output sequence $x_k(n)$ with z-transform $X_k(z)$ can be viewed as an estimate of the short-time spectral energy localized at frequency $\omega_k=2\pi k/M$, $k=0, 1, \ldots, M-1$, and at discrete time index n. It can be shown that $X_k(z)=H_k(z)X(z)$, which is therefore the z-transform of the output of the $k^{th}$ bandpass filter.

Figure 1B:
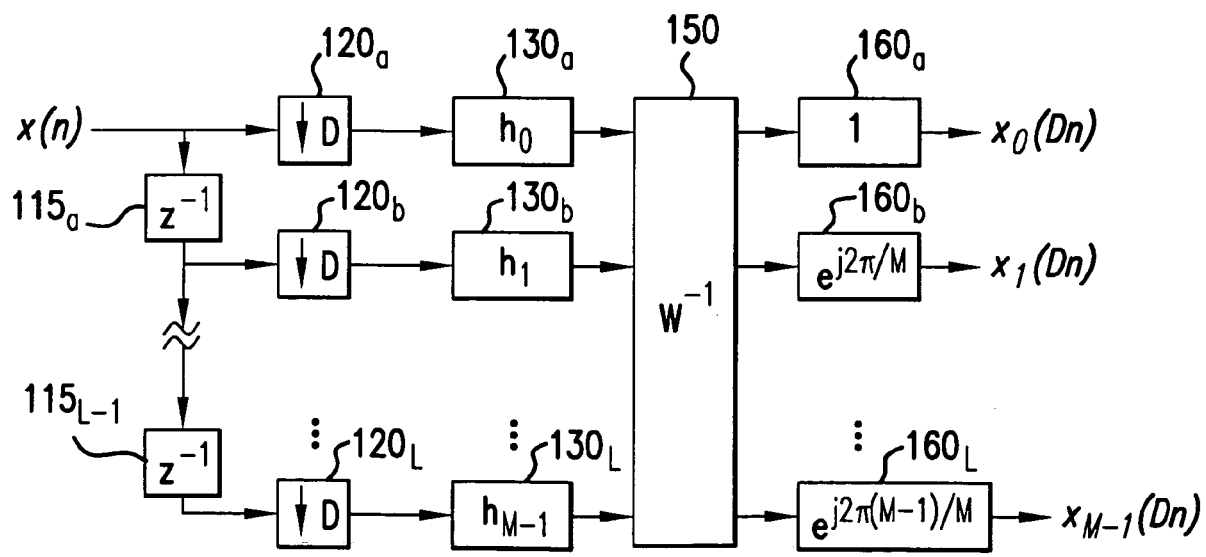
FIG. 1B is a block diagram of the prior art uniform DFT filter bank with decimation applied.

By inserting a decimator $120_a$–$120_L$ into each filter channel of the DFT filter bank, as shown in FIG. 1B, a decimated version thereof is formed. The decimation factor D can take on values $1, 2, \ldots, M$, provided that the ratio M/D is an integer. For the case of D=1 or no decimation, the system illustrated in FIG. 1B reduces to the system of FIG. 1A, i.e., a windowed DFT with an overlap of M−1 samples. For D=M, the structure is maximally-decimated with no overlap between successive spectral estimates. Thus, the decimator determines the overlap in time between estimates. It is well known that a discrete time signal operated on by any decimator is subject to aliasing, a problem which is addressed below.

Figure 2:
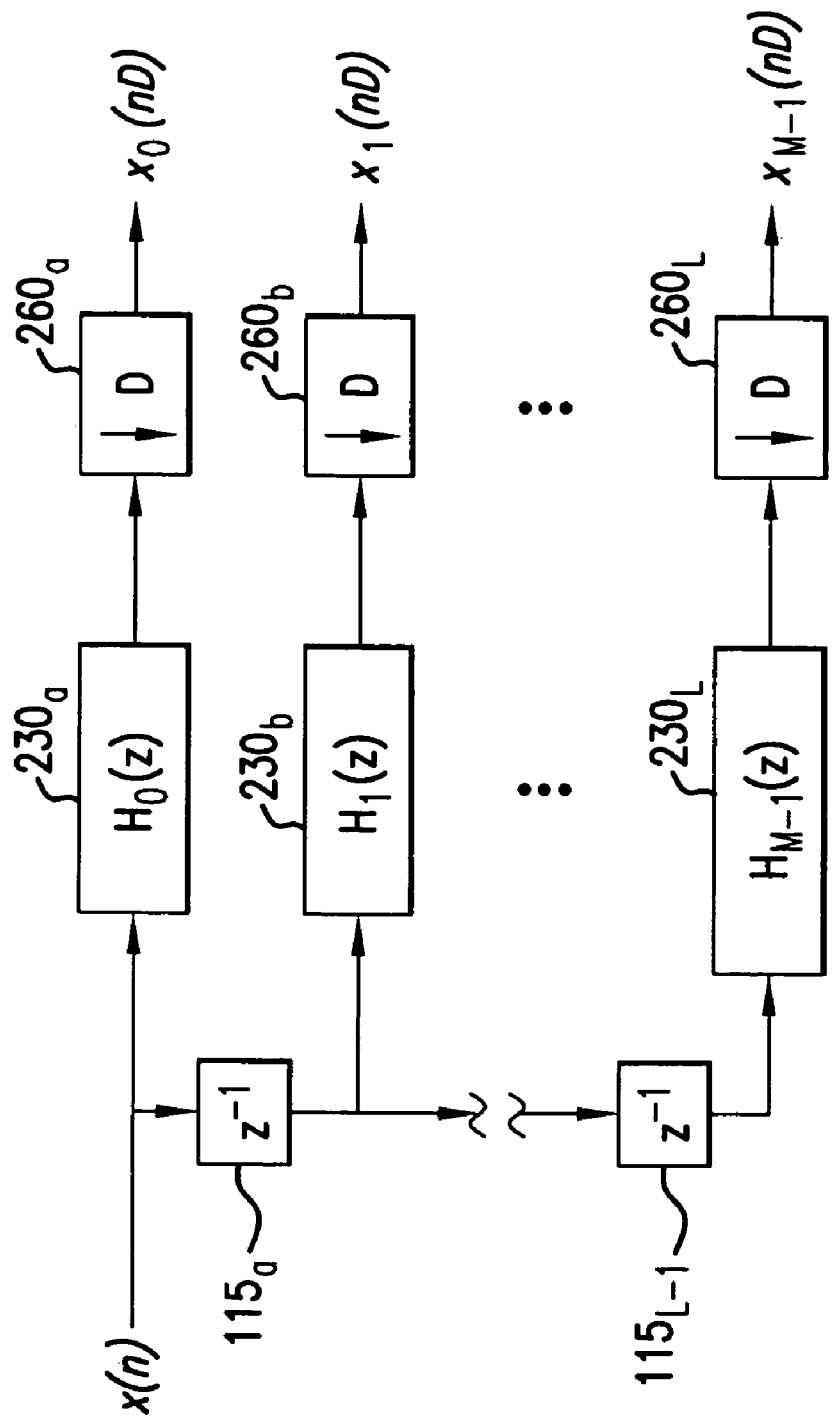
FIG. 2 is a filter bank equivalent of the DFT structure of FIG. 1B.

It is emphasized that the structure of FIG. 1B is equivalent to that of FIG. 2, where the filter transfer functions $H_k(z)$ in filters $230_a$–$230_L$ are defined by equations (1)–(3). In other words, the DFT implementation of FIG. 1B can be modeled as a bank of bandpass filters $230_a$–$230_L$ of order M−1 whose outputs are decimated by decimators $260_a$–$260_L$, respectively.

In the field of multirate signal coding, it is known to allow the order of baseband filter N to be greater than M−1 defined for the conventional DFT of Eq. (1). Consequentially, the scalars $h_k$ in the blocks $130_a$–$130_L$ of FIG. 1A and FIG. 1B become polynomials in z. This change affects the time-frequency tradeoff, aliasing, latency and computational complexity of the spectral analysis, as will be further discussed in paragraphs that follow.

Figure 3:
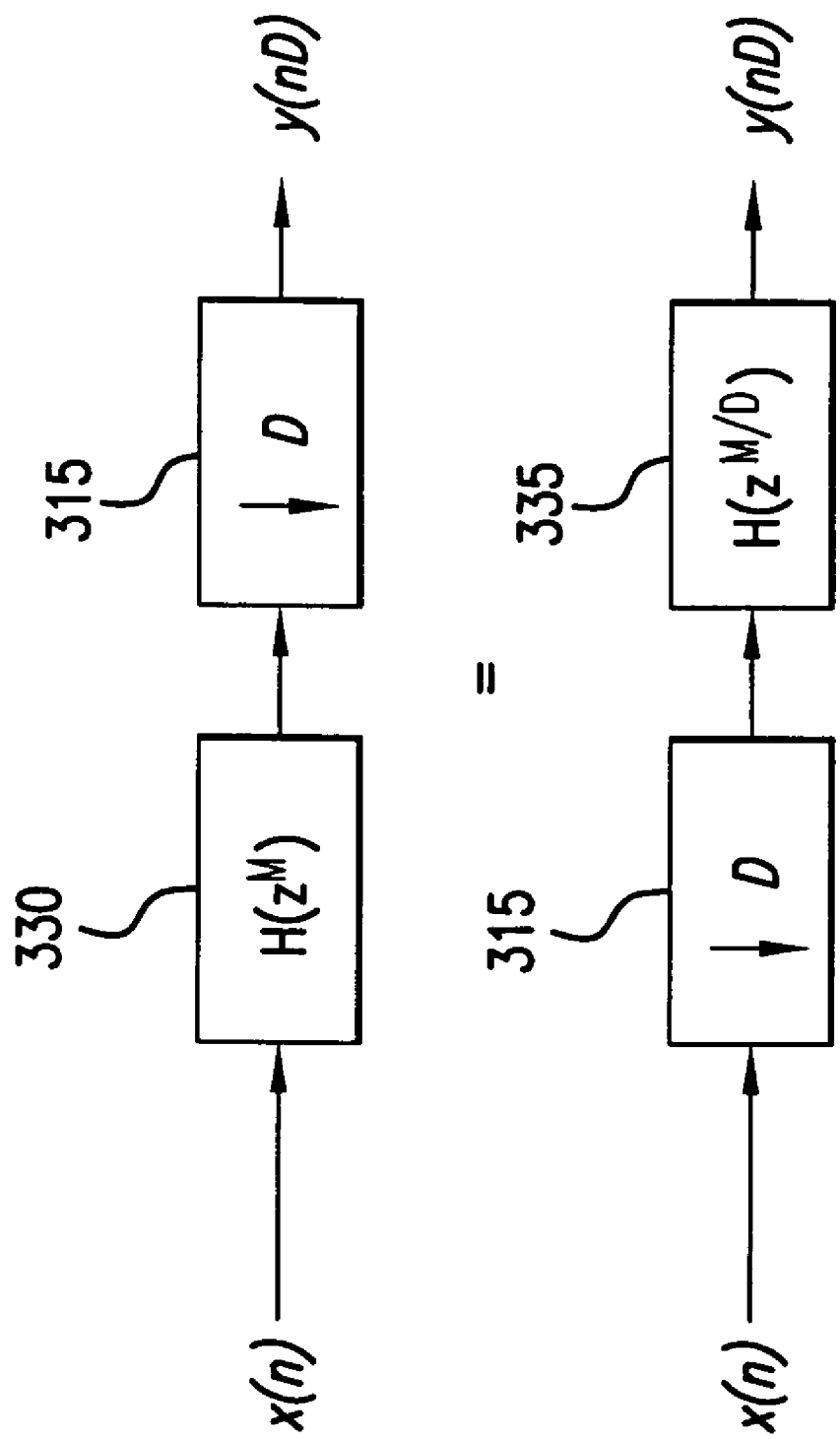
FIG. 3 is a block diagram illustrating the Noble identity.

The well-known Noble identities are often exploited in multirate analysis, one of which is diagrammatically depicted in FIG. 3. The illustrated identity permits the cascade of a transfer function $H(z^M)$, indicated at 330 followed by a decimator 315 to be commuted to a cascade of decimator 315 followed by a transfer function $H(z^{M/D})$ shown at 335. This identity is valid as long as $H(z^{M/D})$ can be expressed in integer powers of z; that is, the ratio M/D must be an integer.

It is well known that any FIR filter, such as the baseband filter $H_0(z)$ at $230_a$ of FIG. 2, can always be decomposed into its polyphase components. For a Type-I decomposition with polyphase components $E_k(z)$, $k=0, 1, \ldots, M-1$, the baseband filter can be expressed as:

$$H_0(z) = \sum_{k=0}^{N} E_k(z^M) z^{-k}. \tag{5}$$

Figure 4A:
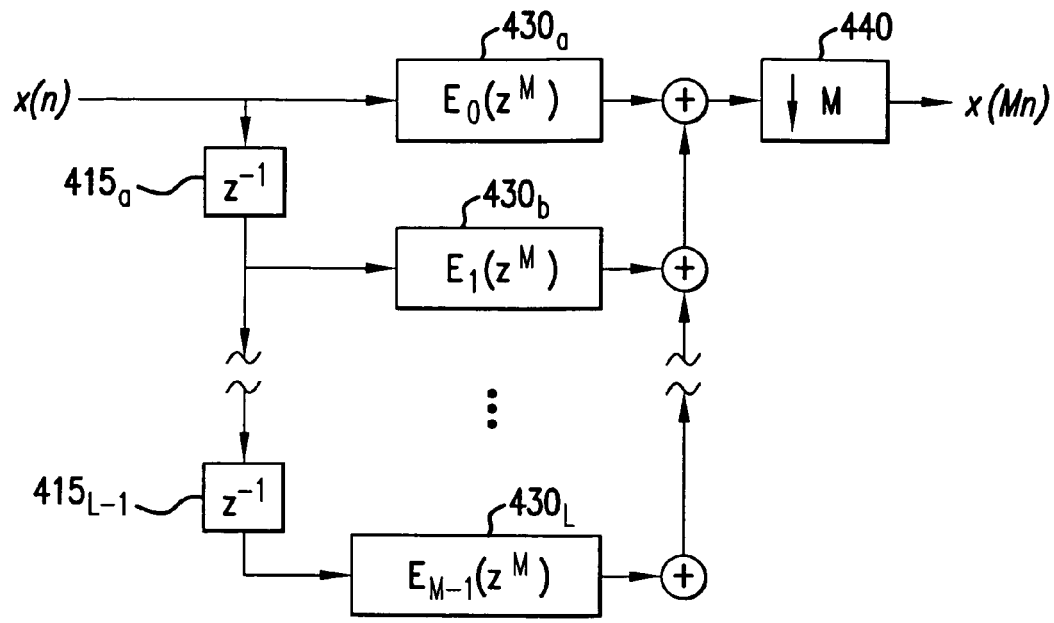
FIGS. 4A–4E are block diagrams of polyphase decomposition of a low pass filter with decimation applied as implemented by the present invention.

According to the Nyquist criterion, if $H_0(z)$ is assumed to be sharply lowpass with passband cutoff $\pi/M$, the filter may be decimated by M. The resulting structure is that of FIG. 4A.

Figure 4B:
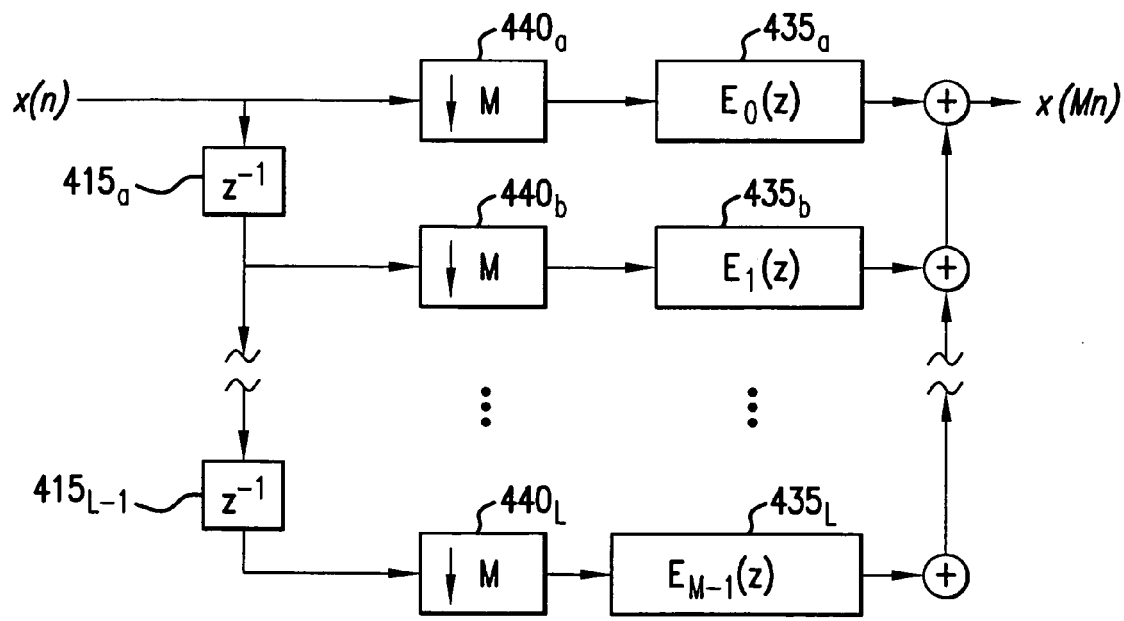
Figure 5A:
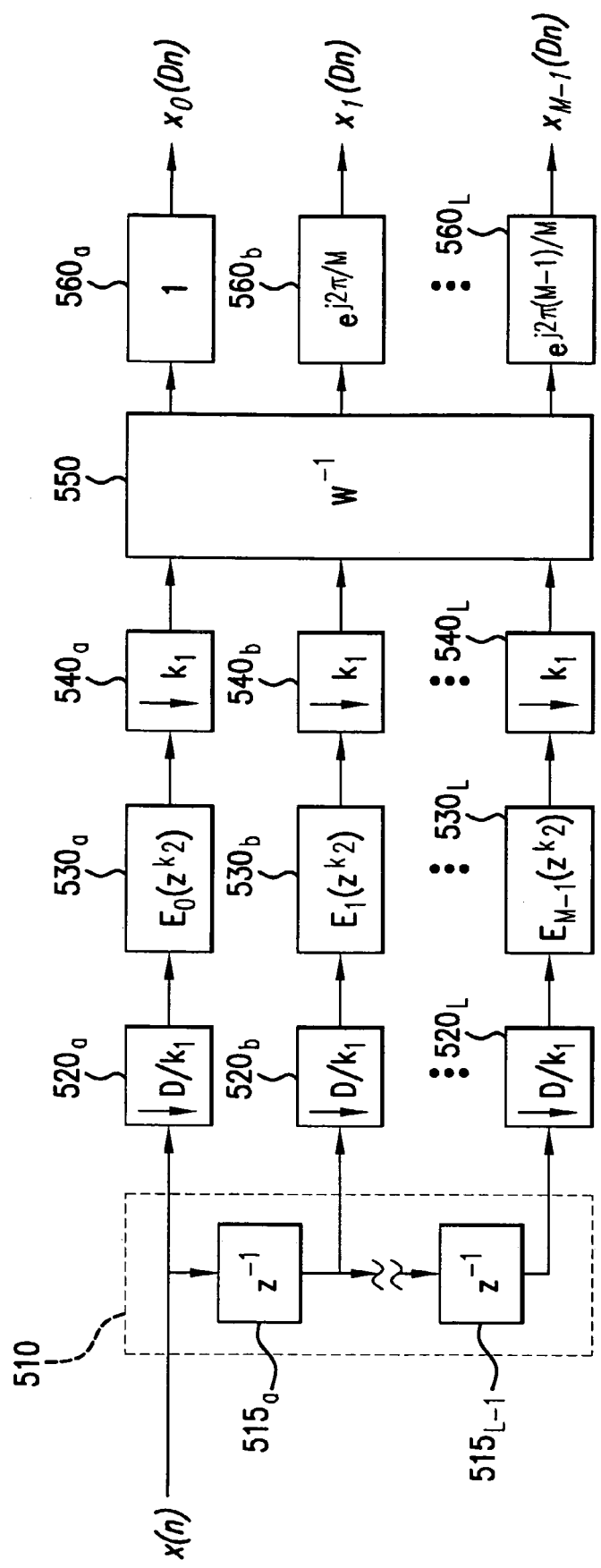
FIG. 5A is a block diagram of one embodiment of the present invention.

The baseband filter is assumed to be $N^{th}$-order FIR, N>M−1, with impulse response $h_0(n)$, $n=0, 1, \ldots, N$. The Type-I polyphase filters are then computed by:

$$E_k(z) = \sum_{n=0}^{\lfloor N/M \rfloor} h_0(Mn+k)z^{-n}, \tag{6}$$

where the $\lfloor \cdot \rfloor$ operator returns the integer part of its argument. Thus, a lowpass filter sharply band limited to $(1/M)^{th}$ the total bandwidth and decomposed into its polyphase components can be maximally decimated by M and implemented with the system of FIG. 4B. An entire filter bank can be so constructed by substituting an inverse DFT matrix for the adder tree. The inverse DFT modulates the bandpass filter to M−1 bandpass filters consistent with Eq. (4). Such a structure is illustrated in FIG. 5A, a discussion of which is in paragraphs that follow.

Figure 4C:
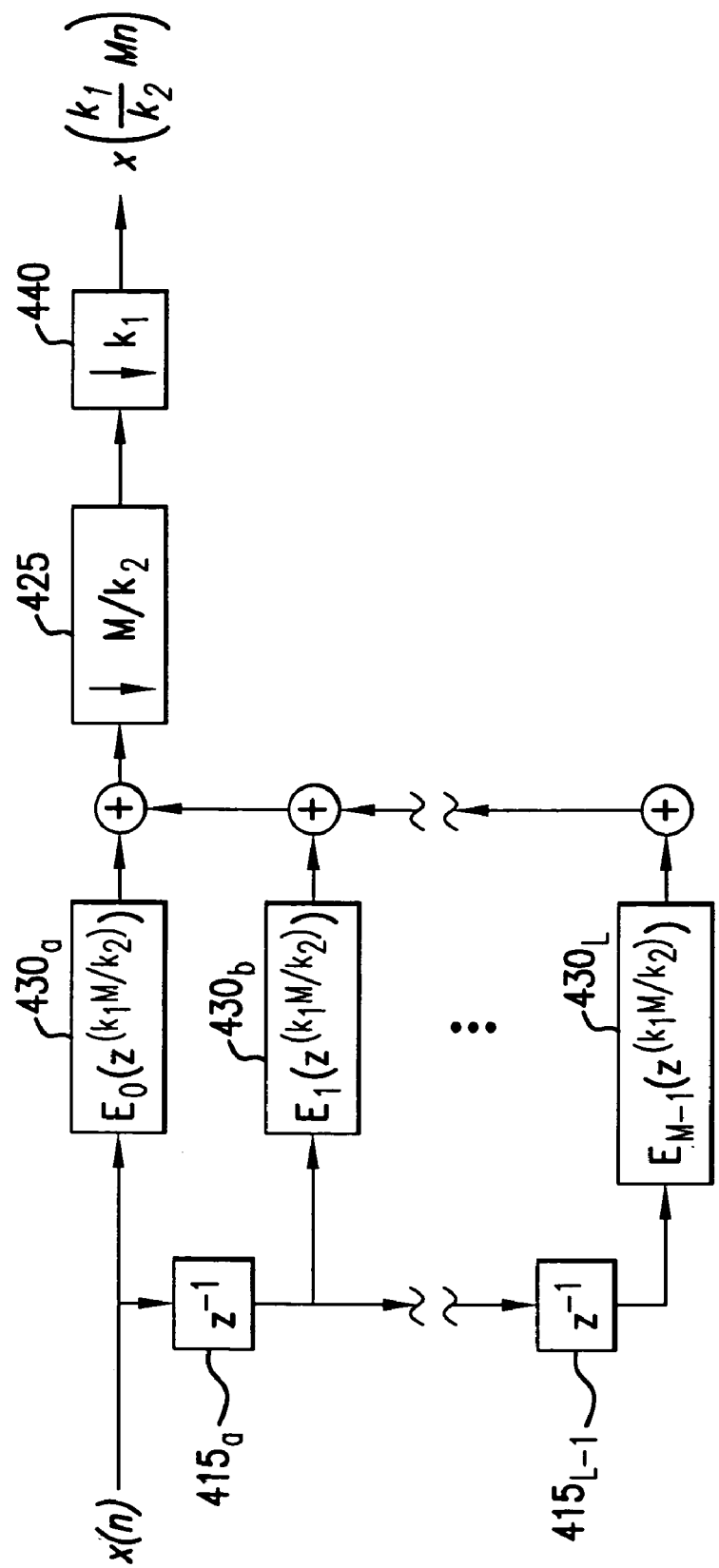
Figure 4D:
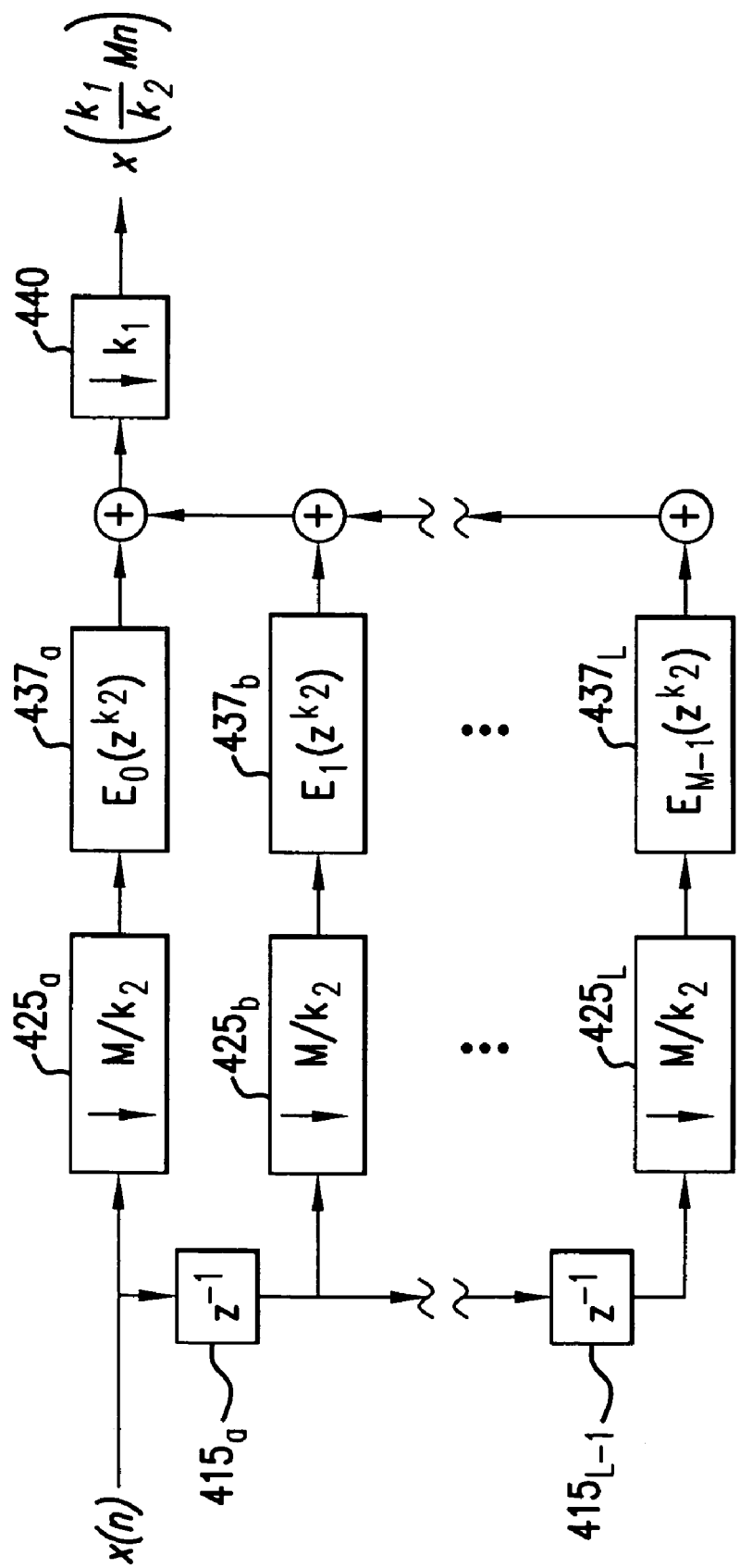
Figure 4E:
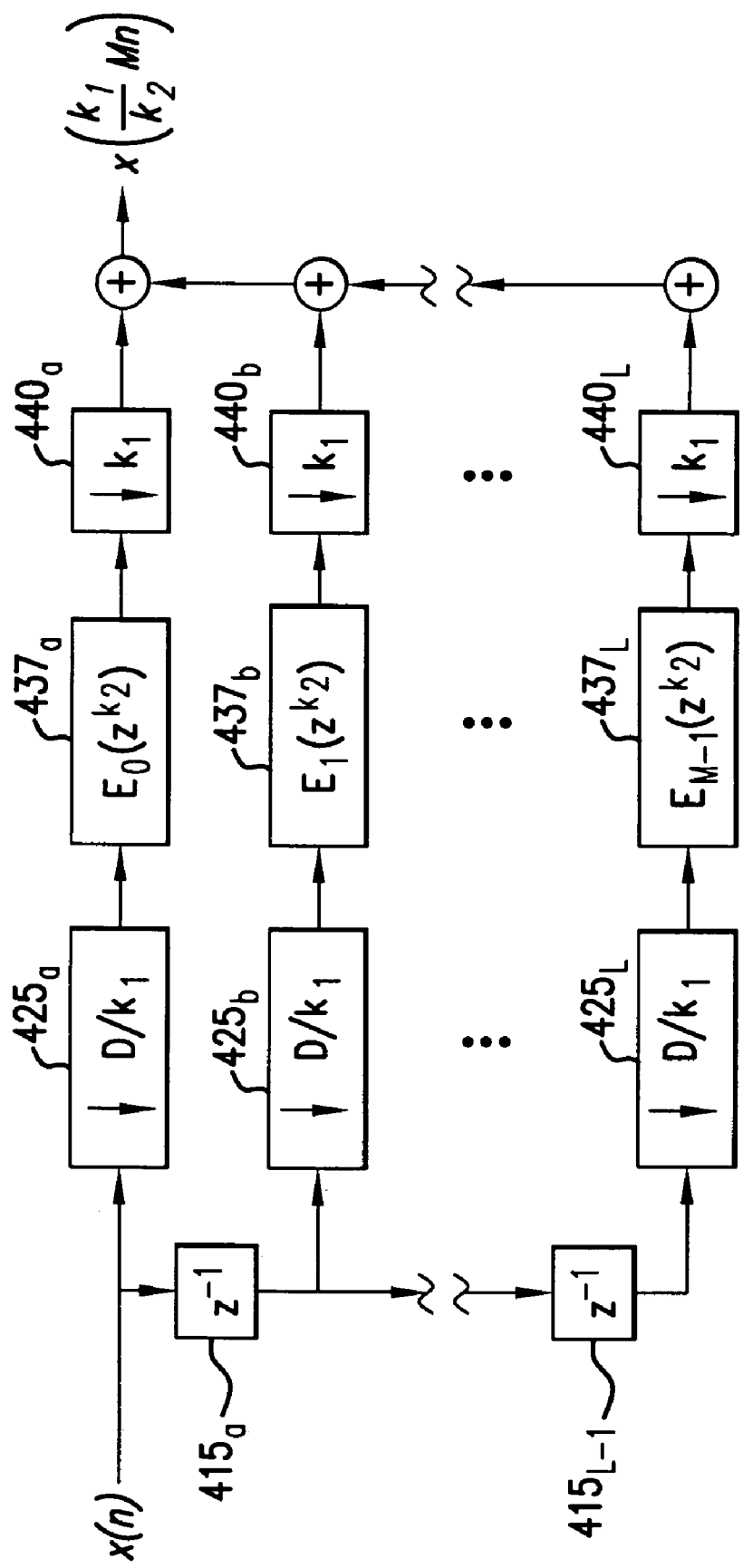

It is an object of the present invention to allow temporal overlap by other than integral factors of the number of filters M in the filter bank. To that end, certain embodiments of the present invention achieve the desired decimation via two decimators 425, 440, as shown in FIG. 4C, where the substitution $M'=k_1 M/k_2$ has been applied to Eq. (5). If $M/k_2$ is constrained to integer values, i.e., $k_2$ being a factor of M, the Noble identity permits the system of FIG. 4C to be restructured to that of FIG. 4D, i.e., decimator 425 is inserted between the input of each filter channel and the filter $430_a$–$430_L$ thereof, as decimators $425_a$–$425_L$. The filtering is now performed at $(k_2/M)^{th}$ the input rate as shown at $437_a$–$437_L$. This property dramatically reduces the computational requirements of the system of FIG. 4D relative to the system of FIG. 4C. Then, as shown in FIG. 4E, decimator 440 may be inserted into each filter channel as decimators $440_a$–$440_L$ so that the sequences decimated by $D=k_1 M/k_2$ can be modulated by an inverse DFT, as described below. Note that D is an integer value, in that $k_2$ is a factor of M and $k_1$ is an integer. Thus, the ratio $D/k_1$ is an integer value equivalent to $M/k_2$.

Advantageous features of the present invention may be illustrated by a numerical example. Suppose the number of filters in the filter bank is set to M=100. If M/D is required to be an integer value, then the allowable values for D are D=1, 2, 4, 5, 10, 20, 25, 50 and 100. The corresponding values of overlap, M−D, are 99, 98, 96, 95, 90, 80, 75, 50 and 0, respectively. If, however, $M/k_2$ to be an integer, i.e., the original values of D given above, and allow integral values for $k_1$ to provide $D=k_1/k_2 M$, D is allowed to take on the values of Table 1. The corresponding overlap respectively achieved by each decimation factor is also given in Table 1. As is shown by this simple example, the present invention provides significant flexibility in the choice of overlap between successive spectral estimates. The added flexibility in overlap selection further increases the applicability of the filter bank system of the present invention as a general use spectrum analyzer.

TABLE 1

| D | M-D | D | M-D | D | M-D | D | M-D | D | M-D |
|---|---|---|---|---|---|---|---|---|---|
| 1 | 99 | 22 | 78 | 44 | 56 | 65 | 35 | 86 | 14 |
| 2 | 98 | 24 | 76 | 45 | 55 | 66 | 34 | 88 | 12 |
| 4 | 96 | 25 | 75 | 46 | 54 | 68 | 32 | 90 | 10 |
| 5 | 95 | 26 | 74 | 48 | 52 | 70 | 30 | 92 | 8 |
| 6 | 94 | 28 | 72 | 50 | 50 | 72 | 28 | 94 | 6 |
| 8 | 92 | 30 | 70 | 52 | 48 | 74 | 26 | 95 | 5 |
| 10 | 90 | 32 | 68 | 54 | 46 | 75 | 25 | 96 | 4 |
| 12 | 88 | 34 | 66 | 55 | 45 | 76 | 24 | 98 | 2 |
| 14 | 86 | 35 | 65 | 56 | 44 | 78 | 22 | 100 | 0 |
| 15 | 85 | 36 | 64 | 58 | 42 | 80 | 20 | | |
| 16 | 84 | 38 | 62 | 60 | 40 | 82 | 18 | | |
| 18 | 82 | 40 | 60 | 62 | 38 | 84 | 16 | | |
| 20 | 80 | 42 | 58 | 64 | 36 | 85 | 15 | | |

It is known that maximally-decimated structures correspond to no overlap between successive spectral estimates.

Overlaps are obtained by decimating by $D \leq M$, provided that $M/D$ is an integer, as shown in FIG. 5A, where $D=k_1 M/k_2$. Equation (6) then becomes:

$$E_k(z) = \sum_{n=0}^{\lfloor N/D \rfloor} h_0(Dn+k)z^{-n}. \quad (7)$$

The structure of FIG. 5A can be considered a generalization of the conventional overlapped DFT of FIG. 1B. In fact, if the baseband filter order N is defined to be $N=M-1$, and if the baseband filter defines any M-point DFT window, e.g., Hamming, rectangular, etc., then the corresponding polyphase filters obtained by decomposing such a baseband filter become scalars equal to the window values:

$$E_k(z^D) = E_k(z) = h_k, \, k=0, 1, \ldots, M-1. \quad (8)$$

This follows from straightforward application of both Eq. (7) and the Noble identity. Therefore, the main difference between the subband filter structure depicted in FIG. 5A and the conventional DFT structure of FIG. 1B is that the former is derived from a baseband filter of higher order N that decomposes into polyphase filters which are not scalars, but are polynomials in z of order $\lfloor N/D \rfloor$. For the conventional DFT structure of FIG. 1B, the corresponding polyphase filters are always of order 0, i.e., they are always scalars irrespective of z.

As shown in FIG. 5A, the input sequence, $x(n)$, is applied to the input port of a tapped delay line 510. The tapped delay line, such as is known in the art, consists of a plurality of delay elements $515_a$–$515_{L-1}$ interstitially coupled to L taps. Each delay line tap is coupled to one of the filter channels of the filter bank.

In certain embodiments of the present invention, each filter channel consists of a first decimator, $520_a$–$520_L$, respectively, a filter $530_a$–$530_L$, respectively, and a second decimator $540_a$–$540_L$, respectively. The filtered and decimated data sequence is then presented to transform processor 550 for modulation in accordance with Eq. (4). The modulated data sequence is then phase compensated for the inverse ordering effected by the delay line 510, as discussed above, by phase compensators $560_a$–$560_L$. The resulting signal at each output port of the system of FIG. 5A is a time-indexed data sequence corresponding to one of the passbands of the polyphase filters of the filter bank. As such, the system of FIG. 5A forms a nonparametric spectral analyzer composed of M data bins corresponding to the M frequency bands of the filter bank.

Figure 5B:
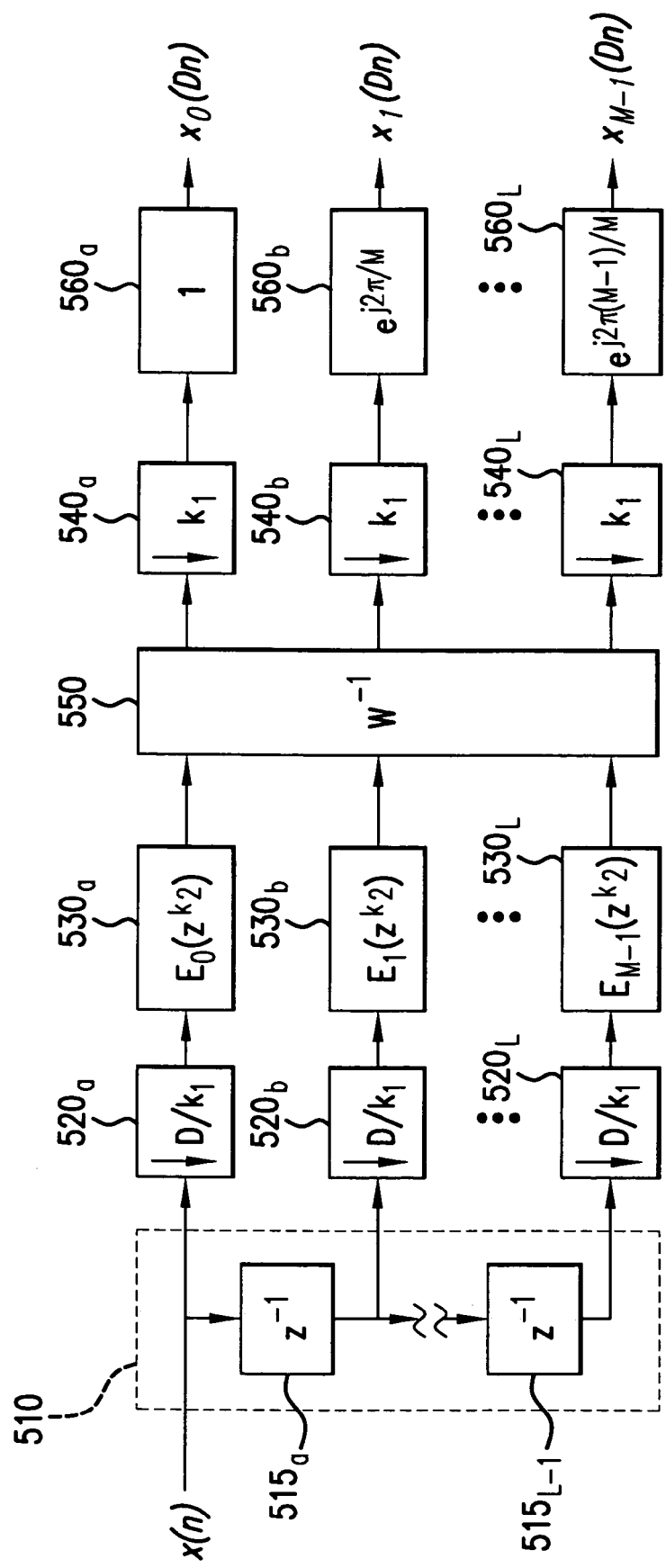
FIG. 5B is an alternative embodiment of the present invention.

In alternative embodiments of the present invention, decimation by the second decimator $540_a$–$540_L$ is performed after modulation by transform processor 550, as shown in FIG. 5B. This is allowed by the fact that the data on each output channel is a time-indexed sequence corresponding to a frequency-indexed output channel. As such, transform properties relating to decimation of frequency-transformed data across transform processor 550 may not apply.

Baseband FIR filters required for the structure of FIG. 5A can be designed using any conventional technique. For example, truncated Fourier series approaches or the Remez algorithm may be used. With the truncated Fourier series, Eq. (2) still defines the baseband filter impulse response, but unlike the DFT case, $h_{LP}(k)$ is now defined as a near ideal lowpass filter:

$$h_{LP}(k) = \frac{\sin[\pi(k-N/2)/M]}{\pi(k-N/2)}, \, k = 0, 1, \ldots, N. \quad (9)$$

Figure 6:
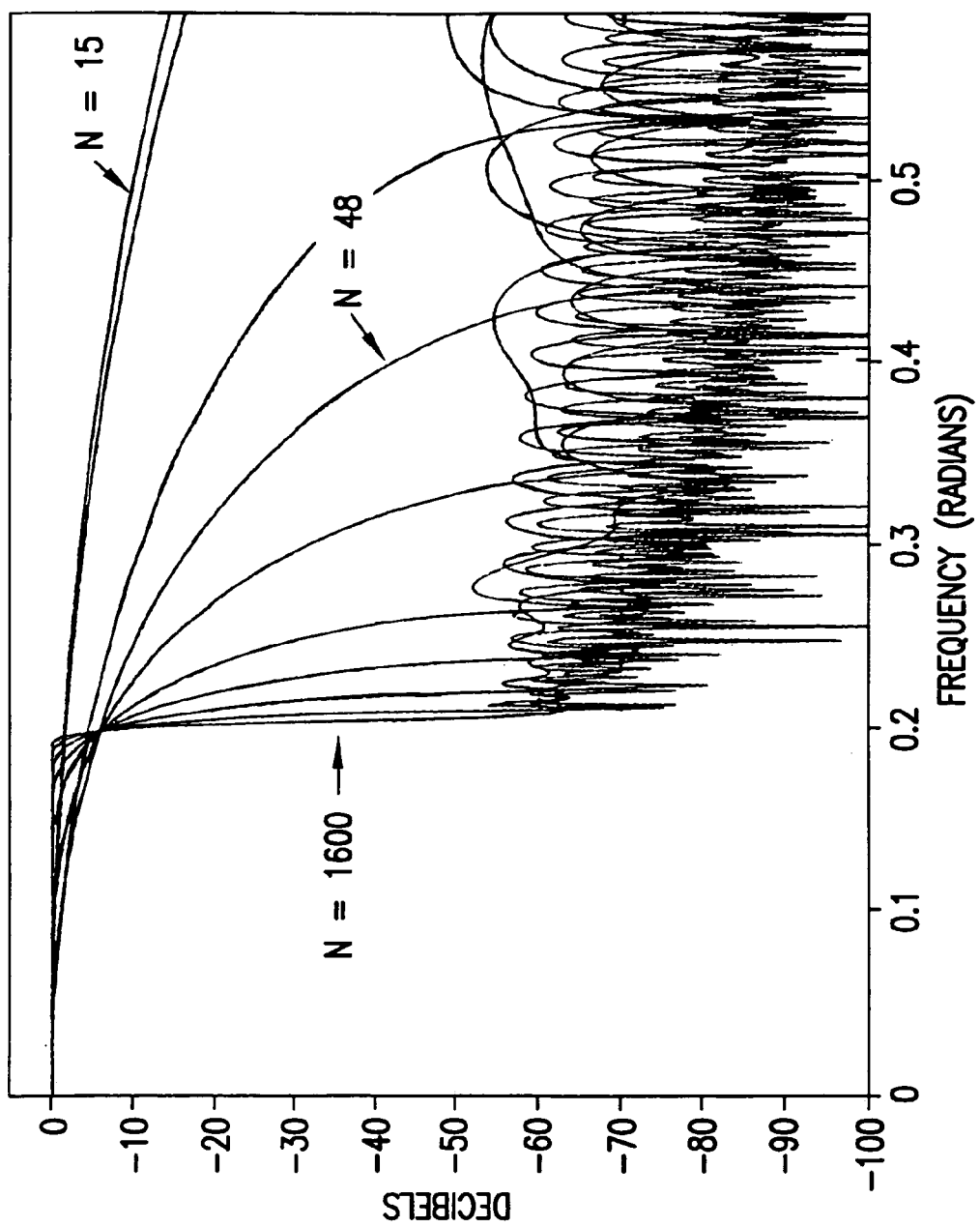
FIG. 6 is a graph illustrating the frequency responses of several FIR baseband filters.
Figure 7:
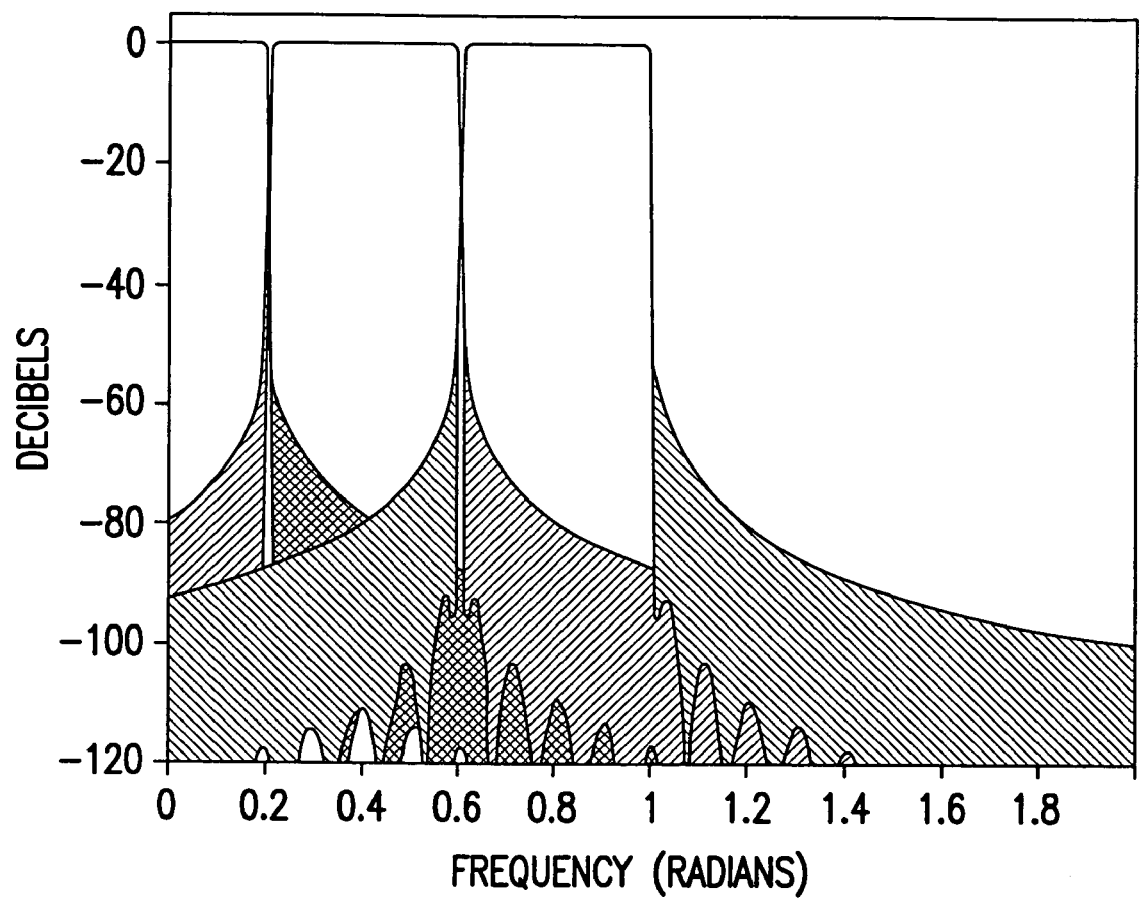
FIG. 7 is a graph illustrating the frequency responses of the baseband filter and the first two bandpass filters of a polyphase filter bank.

FIG. 6 displays frequency responses of several Hamming baseband filters for $M=16$, designed using the truncated Fourier series approach. The arrows indicate responses for several values of the baseband order N. The Figure again illustrates that the conventional DFT, which by definition corresponds to $N=M-1=15$, with corresponding polyphase filter order zero, is simply a special case of a filter bank whose baseband filter is designed with a higher order. In fact, the baseband filter can be designed with N large enough to approximate an ideal lowpass filter. This near-ideal filter will possess a flat passband response, a passband edge close to $\pi/M$, and low stopband ripple. The remaining $M-1$ filters in the filter bank possess similar responses, but shifted in frequency. FIG. 7 illustrates the responses of the first three filters of a near-ideal filter bank constructed from the Hamming baseband filter, $N=1600$, whose response is shown in FIG. 6.

The additional computational cost of the system of FIG. 5A over FIG. 1B is modest. It is clear that for a fixed D the difference in computation is entirely due to the filtering. The number of multiplication operations per input sample due to filtering if $D=1$, i.e., no decimation, is just $N+1$ for either structure. With decimation by $D>1$, the multiplication operations per sample is $(N+1)/D$. As a numerical example, for $M=D=16$, the number of multiplication operations for the conventional DFT structure of FIG. 1B is 17/16 since $N=M-1$. For the structure of FIG. 5A with $N=1600$, the number of multiplication operations increases to only 101. Thus, an entire filter bank of these nearly ideal filters can be implemented efficiently by the present invention.

According to the Nyquist criterion, a sequence band-limited by sharply filtering to $\pi/M$ may have its sample rate reduced by $D \leq M$ without loss of information. Of course, if the filter is not sharp, then aliasing will occur. Because any conventional, windowed, overlapped DFT is equivalent to a multirate filter bank with filters processing significant responses outside $\pi/D$, then any decimation $D>1$, corresponding to overlaps greater than one sample, will result in aliasing.

The connection between overlapped DFT-based spectral analysis and aliasing is rarely made. However, by way of the system of the present invention, aliasing reduction can be achieved via the high-order, multirate filter bank structure of FIG. 5A so as to implement an M-channel spectrum analyzer. The aliasing caused by decimating the lowpass, FIR baseband filter, $H_0(z)$, which will be hereinafter referred to as H(z) for simplicity of notation. The analysis may then be extended to the remaining $M-1$ filters.

Assume the z-transforms of the input and output sequences of the baseband filter H(z) be denoted as X(z) and Y(z), respectively, so that $Y(z)=H(z)X(z)$. The assumption is made that $x(n)$ is a unit input sample $\delta(n)$, so that $X(z)=1$ and $Y(z)=H(z)$. This implies that the effects of aliasing on which focus is given are entirely due to the response of the filter and not to any particular input spectrum.

Let the decimated filter output sequence be denoted by $v(n)$ with corresponding z-transform V(z). By the definition of decimation, $v(n)=y(nD)$. The transform V(z) may be expressed in terms of the non-decimated filter output Y(z) as follows:

$$V(z) = \frac{1}{D}\sum_{k=0}^{D-1} Y(z^{1/D}W^k), \quad (10)$$

where $W^k = e^{-j2\pi k/D}$. Making use of the assumption that $x(n) = \delta(n)$ and evaluation Eq. (10) on the unit circle, the corresponding frequency response is:

$$V(e^{j\omega}) = \frac{1}{D}\sum_{k=0}^{D-1} H(e^{j(\omega - 2\pi k)/D}). \quad (11)$$

The frequency response of the decimated filter output is then seen as the superposition of D shifted and scaled versions of the frequency response of the baseband filter $H(e^{j\omega})$. The first term in the sum represents the energy at baseband. The remaining terms the potentially contribute to aliasing, for which an aliasing spectrum is defined as:

$$A(e^{j\omega}) = \sum_{k=1}^{D-1} H(e^{j(\omega - 2\pi k)/D}), \quad (12)$$

so that:

$$V(e^{j\omega}) = \frac{1}{D}[H(e^{j\omega/D}) + A(e^{j\omega})]. \quad (13)$$

The aliasing energy caused by the multirate filter is defined as the ratio of the aliasing energy in the passband to the total energy and expressed in dB:

$$A_D = 10\log\left(\frac{\int_0^{\pi D/M} |A(e^{j\omega})|^2 d\omega}{\int_0^{\pi} |V(e^{j\omega})|^2 d\omega}\right). \quad (14)$$

This measures the fraction of aliasing energy falling inside $\pi D/M$, the passband edge of an ideal, M-channel, lowpass filter after decimation by D. For the maximally-decimated structure D=M and therefore the energy of $A(e^{j\omega})$ falling between 0 and $\pi$ contributes to aliasing. At the other extreme, D=1, so no decimation occurs and, from Eq. (12), no aliasing occurs either.

Figure 8A:
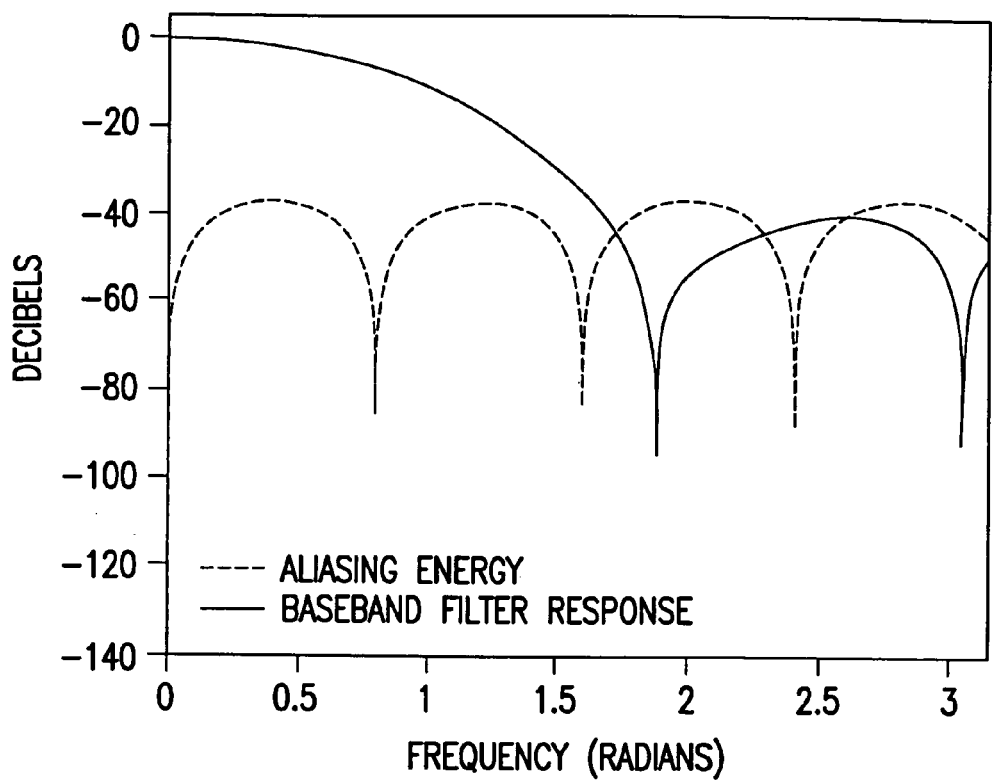
FIGS. 8A–8B illustrate the frequency responses of a baseband filter and the aliasing spectrum for a DFT filter bank for a low order prototype filter.
Figure 8B:
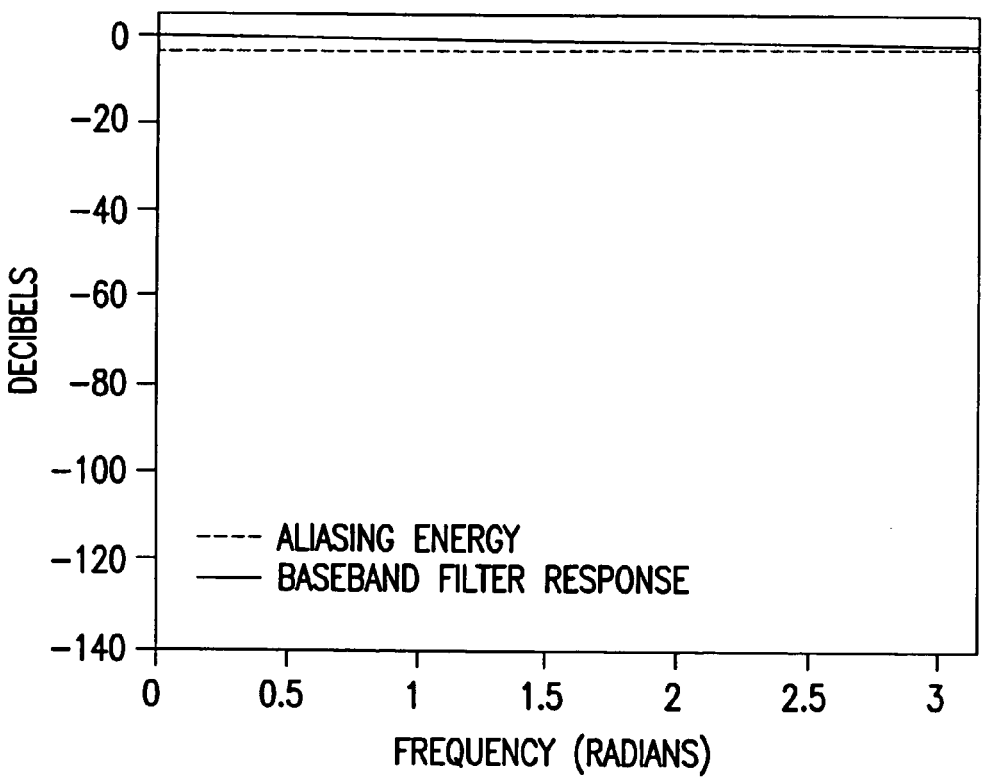
Figure 9A:
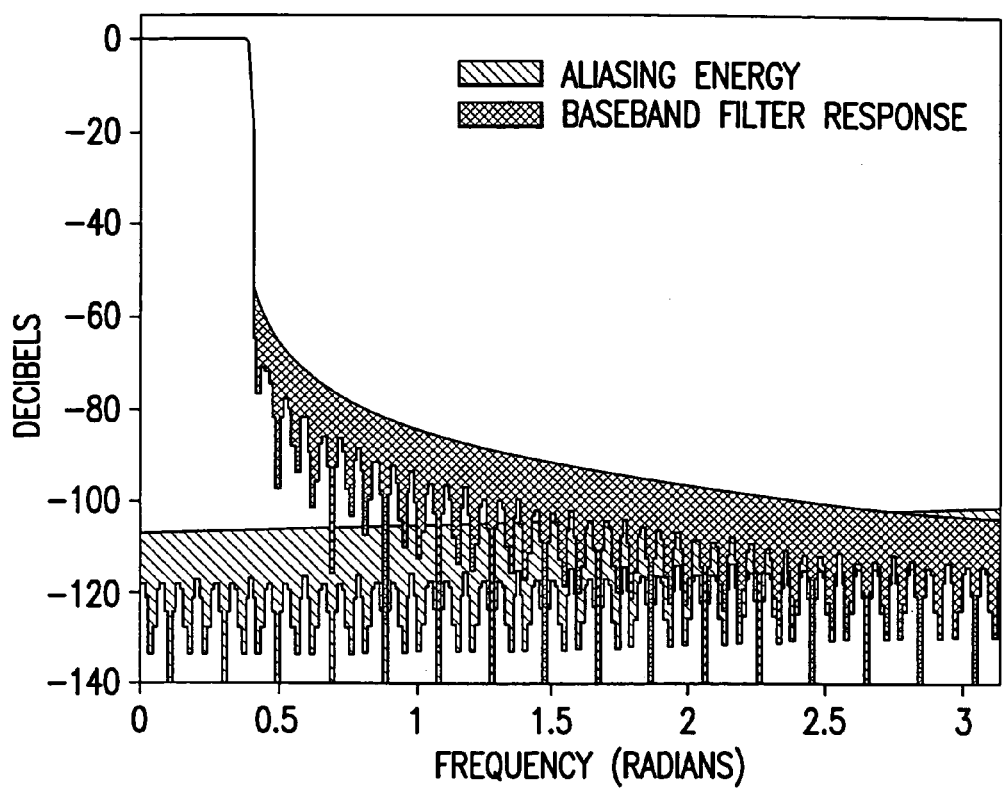
FIGS. 9A–9B illustrate the frequency responses of the baseband filter and aliasing spectrum for a high order multirate filter bank.
Figure 9B:
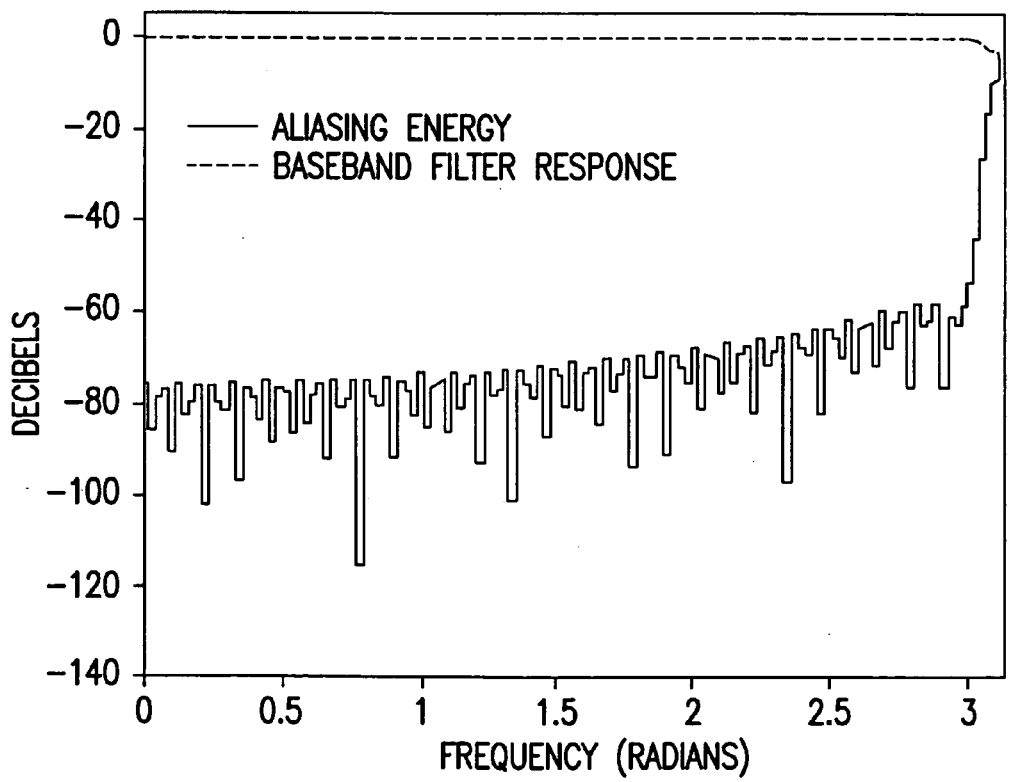

To illustrate the above, consider a multirate filter bank spectrum analyzer for M=16 and a truncated Fourier series, $N^{th}$-order baseband filter design using a Hamming window, for the special case of a DFT, N=M−1=15. FIG. 8A shows the frequency response of the baseband filter $H(e^{j\pi/D})$ after decimation, superimposed with the aliasing spectrum $A(e^{j\omega})$ for D=2. FIG. 8B shows the two responses on the same scale for D=M. The baseband filter clearly does not approximate an ideal lowpass filter whose passband edge should be located at $\omega = \pi D/M = \pi/8$. For D=2, values of $A(e^{j\omega})$ extending below this frequency contribute to aliasing. On the other hand, for D=M=16, values of $A(e^{j\omega})$ extending below $\pi$ contribute to aliasing and thus much more aliasing occurs for this maximally-decimated case. FIG. 9A and FIG. 9B illustrate the situation for a near-ideal baseband filter with N=1600, for D=2 and D=16, respectively. With the near-ideal baseband filter, the aliasing has been dramatically reduced, even for the maximally-decimated case.

Figure 10:
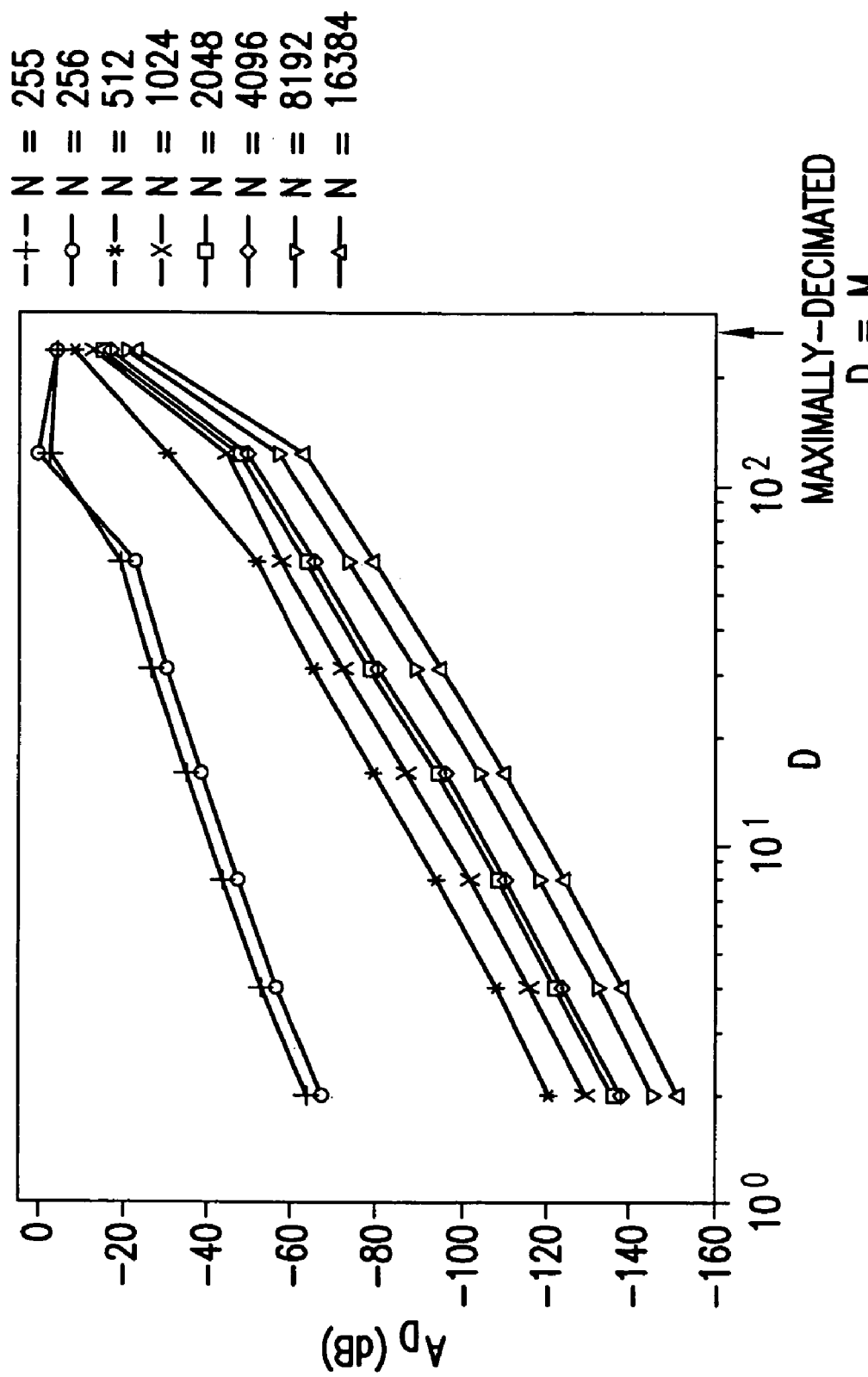
FIG. 10 is a graph depicting the aliasing energy as a function of decimation for various baseband filter orders.

FIG. 10 depicts the aliasing energy for a multirate filter bank with M=256 as a function of the allowable values of D and several different values of N, for a Hamming baseband design using truncated Fourier series. As has been shown, any overlapped DFT spectral analysis is a special case of a multirate spectrum analyzer, one whose passband filter is of order M−1. Because overlap of spectral estimates is equivalent to decimating filter outputs, any decimation D>1 will cause aliasing. Aliasing increases as the decimation increases. However, large-order baseband filters can mitigate the aliasing even at large values of D. For example, FIG. 10 shows that for D=M/2=128, i.e., a 50% overlap, a baseband filter of order N=1024 reduces the aliasing by approximately 45 dB compared to a conventional DFT where, by definition (N=M−1), N=255. In fact, choosing D=M/2 can be considered a "sweet spot" in which aliasing is dramatically reduced over D=M and yet computational requirements remain reasonable. This value of decimation is quite popular in the context of multirate coding and has been examined in the case of DFT and Discrete Cosine Transform filter bank coding. The decimation factor D=M/2 has also been used in so-called lapped orthogonal transform coders.

It should be made clear that aliasing caused by multirate filter bank spectrum analyzers cannot be eliminated as in perfect reconstruction coding systems. However, when compared to FIGS. 9A–9B, the aliasing in the conventional DFT spectrum analyzer is more predominant. Consequently, although aliasing cannot be entirely eliminated, in multirate filter bank spectrum analyzers, it can be reduced to much smaller levels than the conventional DFT spectrum analyzer. Therefore, the absence of the perfect reconstruction property is not a valid reason to exclude multirate filter banks as effective spectrum analyzers.

Resolution in frequency or time, also referred to as localization, is an important property of spectrum analyzers. It is thus useful to consider localization constraints in the implementation of multirate filter banks designed with high-order baseband filters and to compare the localization characteristics with the DFT based system. As previously stated, the multirate spectrum analyzers may be modeled as a bank of M uniform, bandpass filters followed by decimators as shown in FIG. 2. The analysis follows that previously described starting with observing the localization properties of the $N^{th}$-order baseband, real lowpass filter, with transfer function denoted again as H(z) and corresponding impulse response h(n), n=0, 1, ..., N. The results then extend to the remaining M−1 filters. Frequency localization of any such impulse is often defined as:

$$\sigma_\omega^2(h) = \frac{\frac{1}{2\pi}\int_{-\pi}^{\pi}(\omega - \bar{\omega})^2|H(e^{j\omega})|^2 d\omega}{\frac{1}{2\pi}\int_{-\pi}^{\pi}|H(e^{j\omega})|^2 d\omega}. \quad (15)$$

This is interpreted as a variance about the mean frequency $\bar{\omega}$ where $\bar{\omega}=0$ for real filters due to the complex conjugate symmetry of $H(e^{j\omega})$. For complex impulse responses, the frequency response will be identical to that of the baseband filter, but shifted up by the mean frequency. Eq. (15) will then give identical results regardless of the value of the mean frequency, and attention may be paid exclusively to the baseband filter.

Each factor $P(e^{j\omega})$, defined as:

$$P(e^{j\omega}) = \frac{\frac{1}{2\pi}|H(e^{j\omega})|^2}{\frac{1}{2\pi}\int_{-\pi}^{\pi}|H(e^{j\omega})|^2 d\omega}, \quad (16)$$

lies between zero and one, and the integral of the factor with respect to $\omega$ is unity. Therefore, $P(e^{j\omega})$ can be interpreted as a probability function with respect to the distribution of energy in the frequency domain, and hence illustrates why frequency localization is considered to be a variance.

Similarly, time localization is defined as:

$$\sigma_n^2(r) = \frac{\sum_{n=0}^{N-1}(n-\bar{n})^2|h(n)|^2}{\sum_{n=0}^{N-1}|h(n)|^2}, \quad (17)$$

where $\bar{n}$ is defined as:

$$\bar{n} = \frac{\sum_{n=0}^{N-1}n|h(n)|^2}{\sum_{n=0}^{N-1}|h(n)|^2}. \quad (18)$$

Analogous to the frequency domain, each factor $p(n)$:

$$p(n) = \frac{|h(n)|^2}{\sum_{n=0}^{N-1}|h(n)|^2}, \quad (19)$$

lies between zero and one, and the sum of $p(n)$ over n is unity. Therefore, $p(n)$ can be interpreted as a discrete probability mass with respect to the distribution of energy over time. Time localization is interpreted as a variance around the mean group delay $\bar{n}$. Note that time localization is distinct from latency, which is synonymous with the mean group delay $\bar{n}$. For linear phase FIR filters, it is well known and straightforward to show using Eq. (18) that the latency is N/2 samples.

The joint localization, defined as the product of the two individual localizations with associate bound, is given by:

$$\sigma_{n\omega}^2(r) = \sigma_n^2(r)\sigma_\omega^2(r) \geq \frac{1}{4}. \quad (20)$$

Ideally, one would prefer small values on both frequency and time localization. However, the well-known uncertainty principle dictates that the variance must be at least ¼ as indicated, which implies that frequency and time localization cannot both be arbitrarily small.

Approximate localization measures can be derived for an $N^{th}$-order, near-ideal, lowpass filter where h(n) is given by Eq. (9) and N chosen large enough so that:

$$|H(e^{j\omega})|^2 \approx \begin{cases} 1, & |\omega| \leq \pi/M \\ 0, & \text{otherwise.} \end{cases} \quad (21)$$

Using Eq. (21) in Eq. (15) shows that:

$$\sigma_\omega^2(h) \approx \frac{\pi^2}{3M^2}. \quad (22)$$

To derive a closed-form approximation for the time localization of a real, near ideal, FIR filter H(z) with non-causal impulse response h(n), n=−N/2, ..., 0, ..., N/2, where n is even, Parseval's Theorem, $$\sum_{n=-N/2}^{N/2}|h(n)|^2 = \frac{1}{2\pi}\int_{-\pi}^{\pi}|H(e^{j\omega})|^2 d\omega \quad (23)$$

is applied. The frequency response if a near ideal filter with passband edge $\pi/M$ is given by Eq. (19). Substituting this expression into the RHS of Eq. (25) yields:

$$\sum_{n=-N/2}^{N/2}|h(n)|^2 = \frac{1}{M}. \quad (24)$$

Using this result in the definition of time localization of Eq. (16) yields:

$$\sigma_n^2(h) = M\sum_{n=-N/2}^{N/2}(n-\bar{n})^2|h(n)|^2. \quad (25)$$

Substituting the expression for the impulse response of a near ideal filter given in Eq. (9) into Eq. (25), and making use of the facts that $\bar{n}=0$, $\sin^2(O)=0$ and $\sin^2(\alpha)=\sin^2(-\alpha)$, gives:

$$\sigma_n^2(h) = \frac{2M}{\pi^2}\sum_{n=0}^{N/2}\sin^2\left(\frac{\pi n}{M}\right). \quad (26)$$

Using the trigonometric identities $\sin^2\alpha = 1-\cos^2\alpha = 1-[\frac{1}{2}-\frac{1}{2}\cos(2\alpha)]$, Eq. (26) becomes:

$$\sigma_n^2(h) = \frac{M}{\pi^2}\left[\frac{N}{2}+1-\sum_{n=0}^{N/2}\cos\left(\frac{2\pi n}{M}\right)\right]. \quad (27)$$

With the assumption that N>>M, the sum in Eq. (27) is small compared to N/2, providing the approximation:

$$\sigma_n^2(h) \approx \frac{NM}{2\pi^2}. \quad (28)$$

From Eq. (20), it is apparent that N>3M/2, which satisfies the assumption. Eq. (20) also implies that:

$$\sigma_{n\omega}^2(h) \approx \frac{N}{6M}. \quad (29)$$

From the above, it is clear that the frequency localization of an $N^{th}$-order, near ideal lowpass filter is proportional to $1/M^2$, the time localization is proportional to the product NM and the joint localization is proportional to the ratio N/M.

Figure 11:
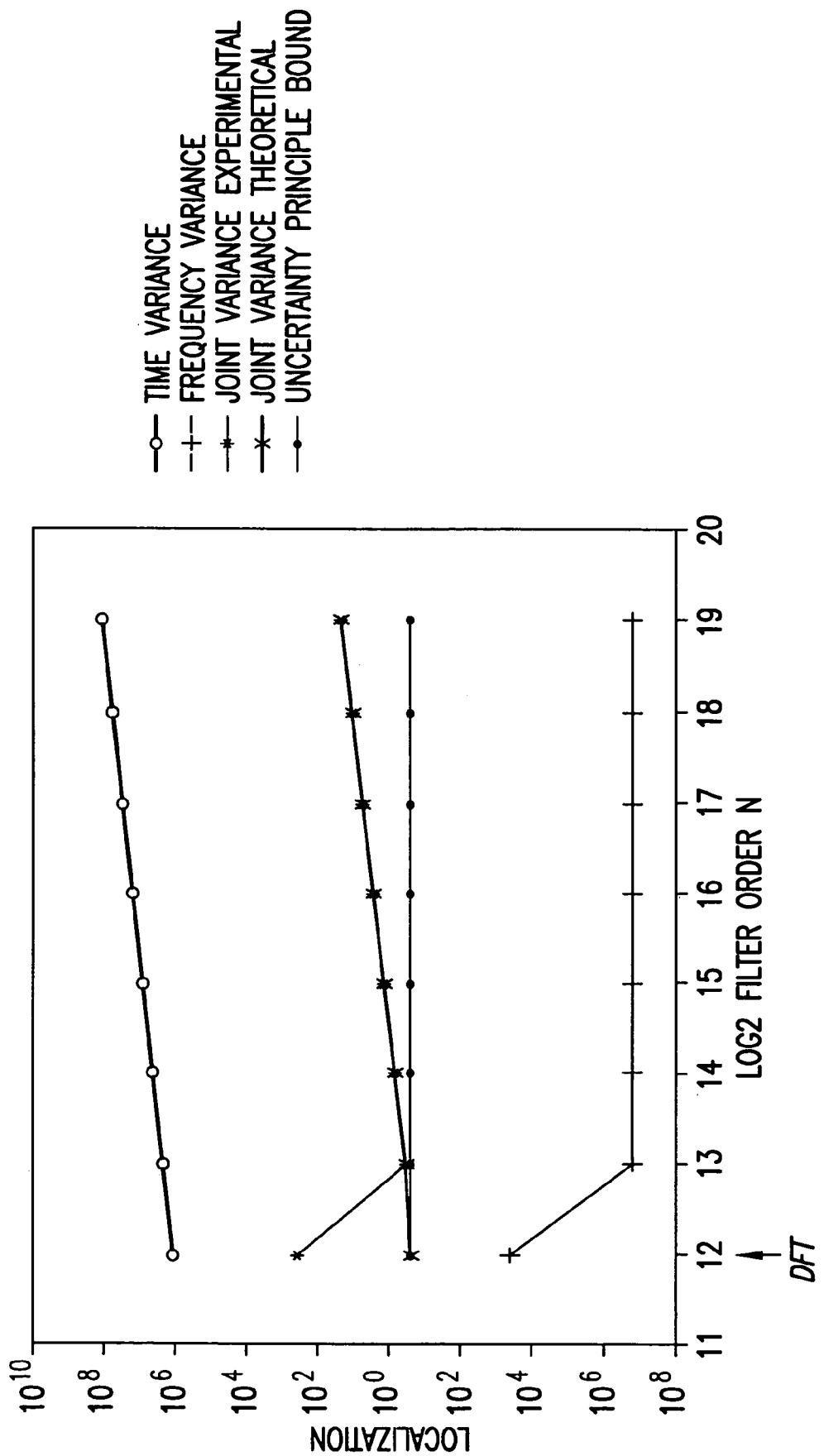
FIG. 11 is a graph illustrating the dependence of localization measurements on filter order.

Taking M to be fixed at 4096, near-ideal low pass filters were designed for several values of N and localization measures were computed by numerical evaluation of Eqs. (15)–(18) and plotted in FIG. 11. Additionally, the theoretical joint localization as computed by Eq. (29) is also plotted in FIG. 11. It is to be noted that N=M−1=4095 is the special case where the baseband lowpass filter corresponds to that of a DFT with sinc window. For this case, it should be noted that the joint localization of the DFT is close to the uncertainty principle bound. Further, it should be observed that the frequency localization is independent of N, consistent with Eq. (22), once N is large enough so that Eq. (21) is valid. Time localization, on the other hand, should be proportional to N as shown in Eq. (28), but again, this approximation is only valid for N>>M. The joint localization is also seen to be proportional to N, again only for N>>M, which then follows the theoretical prediction of Eq. (29).

Near-ideal filters are applicable to slowly changing signals, such as those in sonar applications, because even though their time localization and joint localization are worse than for DFT spectrum analyzers, their frequency localization is improved. In passive sonar, signals of interest are often comprised of tonals whose frequencies vary relatively slowly with time, so that improved frequency localization is highly desirable and may be well worth the degradation obtained in temporal localization.

A commonly-used display in sonar is the lofargram, which displays frequency content over relatively long time segments, typically several minutes or even hours in length. The input is usually beamformed time-series computed from underwater acoustic arrays. Both narrowband and broadband signals appearing in the lofargram are of interest to the analyst. Closely-spaced tonals are often encountered, and one objective of the analysis is to resolve these narrowband components in a low signal-to-noise (SNR) environment and distinguish them from clutter signals such as biologics and surface vessels. The standard computational procedure to obtain the lofargram is the use of the DFT on overlapped segments of the time series. As previously discussed, even when used with a taper function such as the Hamming window, the resulting filter characteristics are relatively poor, exhibiting significant spectral leakage and limiting the analyst's ability to resolve closely-spaced tonals. Improved spectral localization in the lofargram can greatly enhance the analyst's ability to resolve closely-spaced tonals.

Figure 12A:
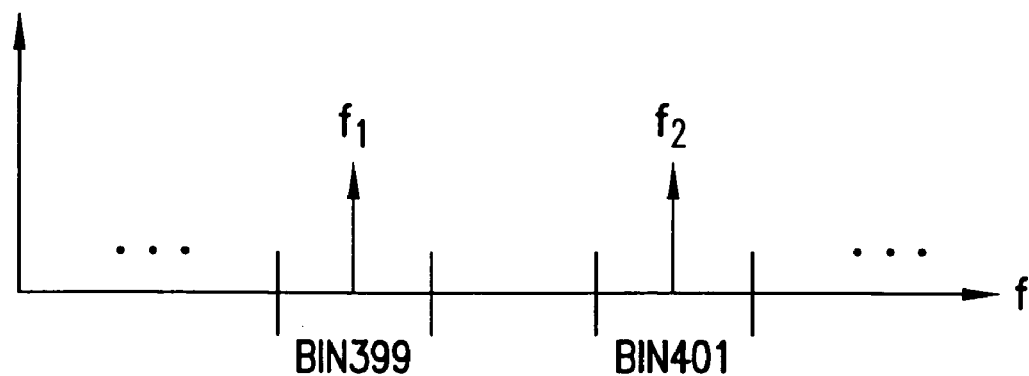
FIGS. 12A–12B are illustrations depicting bin-center and bin-edge frequency separations.
Figure 12B:
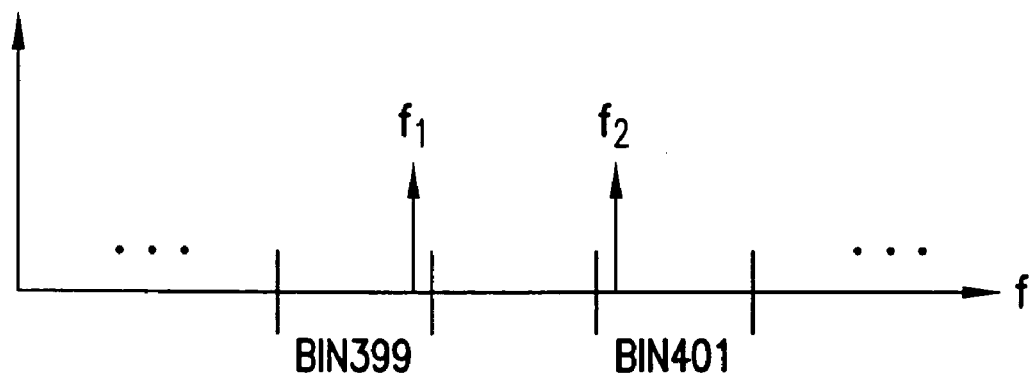

To illustrate this concept, two synthetic tonals were generated with additive Gaussian noise and used as input to both conventional DFT processing and a filter bank of the present invention. Two frequency separations were used: a spacing of 2.0 frequency bins where the tones were centered on the bin, as shown in FIG. 12A, and a spacing of 1.2 bins where the tones were situated near the bin edges, as shown in FIG. 12B. Using a sample rate of 1 Hz, $10^6$ samples of a superposition of two tonals in white Gaussian noise at 0 dB SNR was analyzed using the DFT with no overlap (as implemented by the system of FIG. 1B) for M=1000, using both rectangular and Hamming windows. The resulting frequency bin widths are 0.001 Hz, defined as the separation between bin centers. The tonal frequencies were $f_1$=0.399 and $f_2$=0.401 for the case of bin-centers and frequencies $f_1$=0.3994 and $f_2$=0.4006 for the case of bin-edges. Finally, a maximally decimated filter bank was designed with the Hamming window baseband filter for M=1000, with a baseband filter order of N=100,000. This order was selected so that the ratio NIM=100.

Figure 13A:
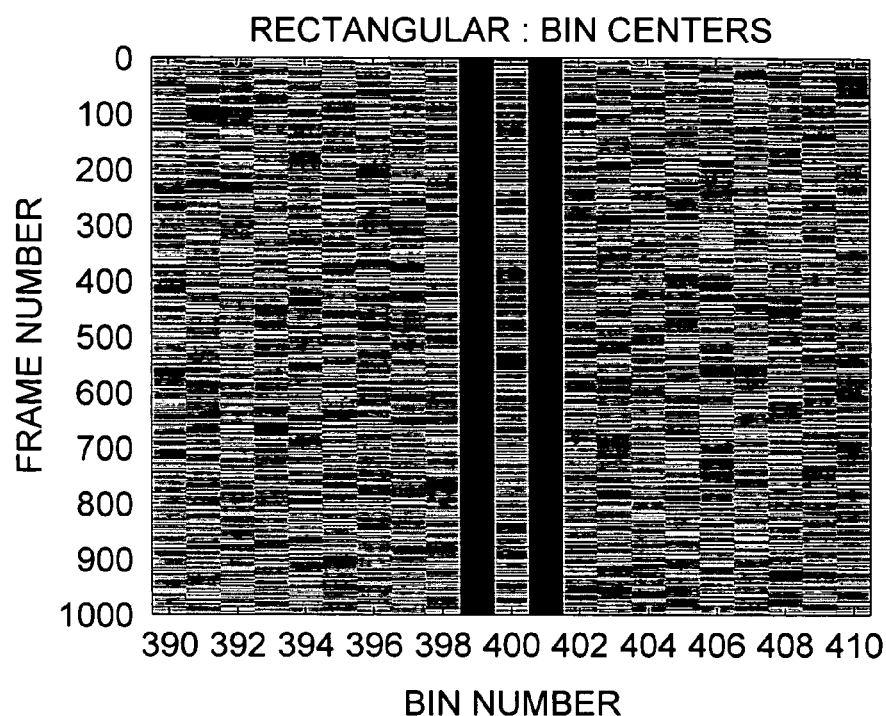
FIGS. 13A–13F are lofargrams of tonals in white Gaussian noise.
Figure 13B:
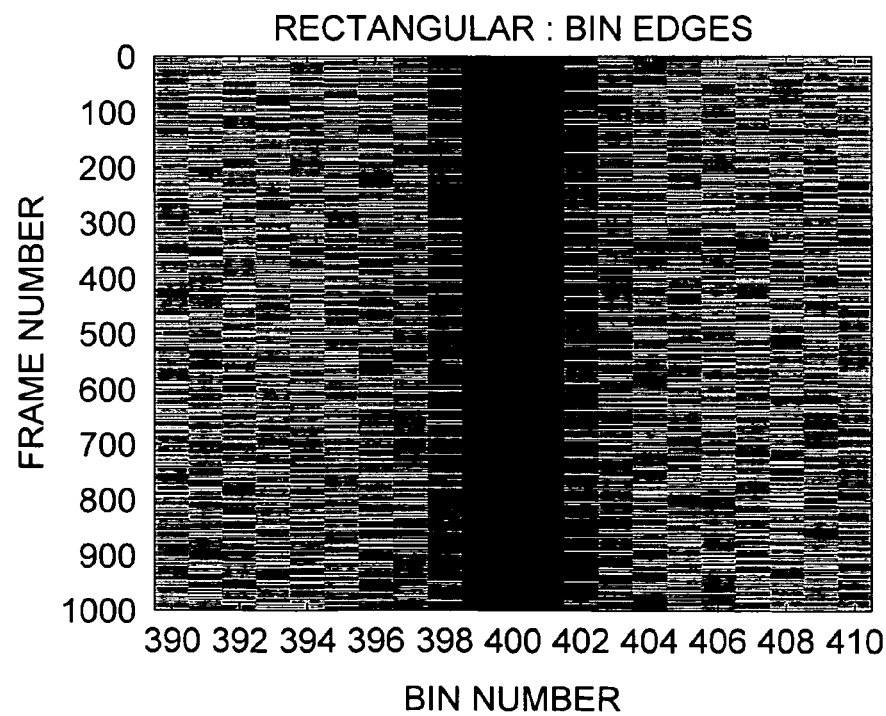
Figure 13C:
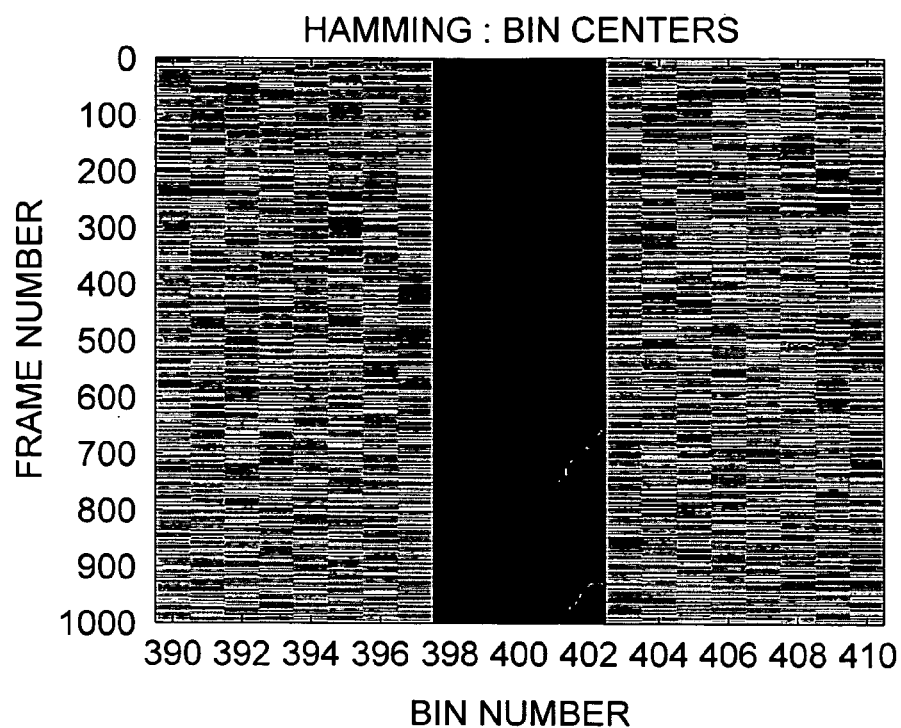
Figure 13D:
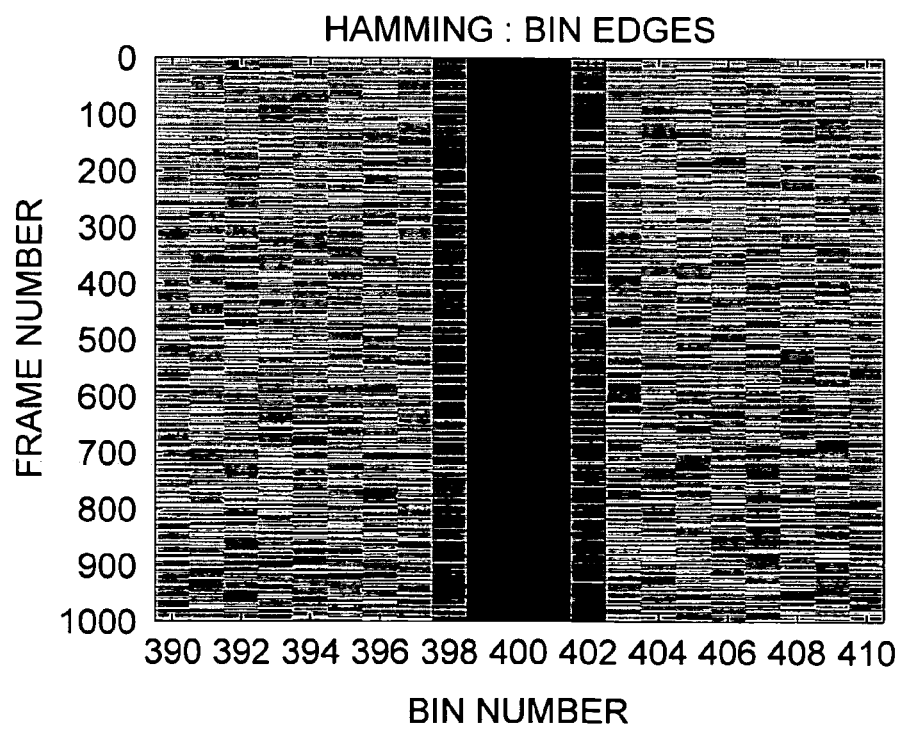
Figure 13E:
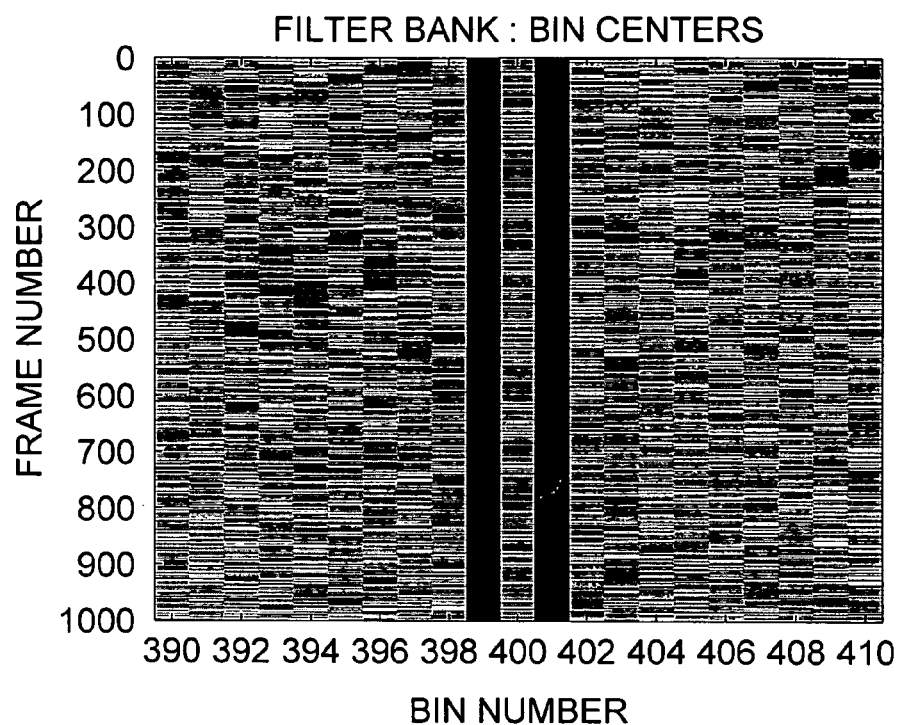
Figure 13F:
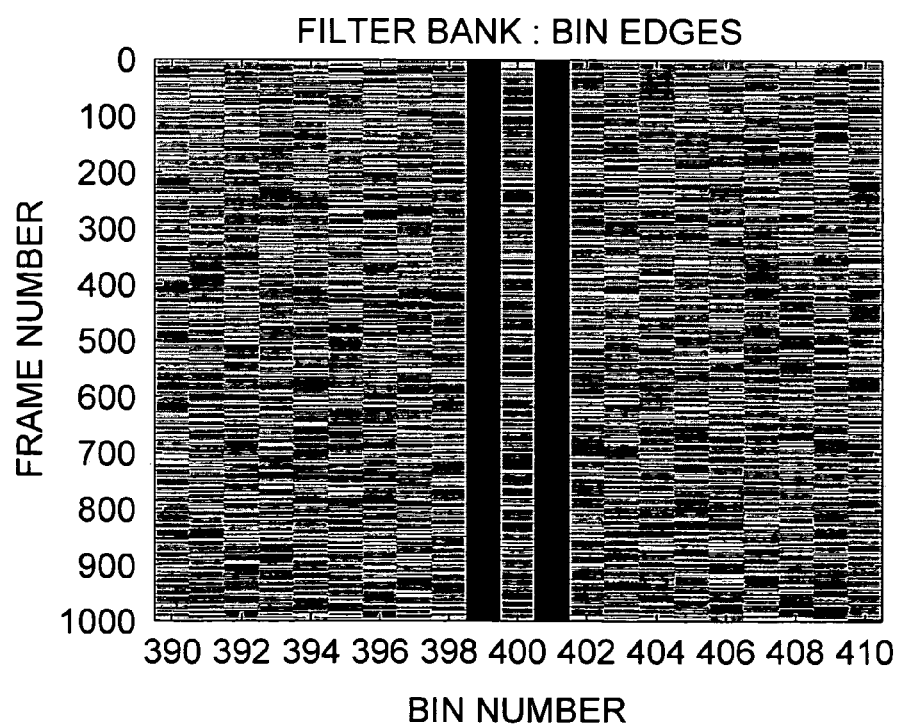

FIGS. 13A–13F illustrate lofargrams for the three spectral analyses (two windowed DFTs and the higher-order filter bank) in the two cases of frequency separation. FIGS. 13A–13B illustrate the rectangular windowed DFT, FIGS. 13C–13D illustrate the Hamming based DFT and FIGS. 13E–13F illustrate the case of the filter bank of the present invention. As is shown in the Figures, the rectangular-windowed DFT processing can resolve only bin-centered tones. Neither rectangular-windowed nor Hamming-windowed DFTs can resolve the bin-edge case. In contrast, the filter bank of the present invention resolves the tones even when the frequency separation is only 1.2 bins. Clearly, the ability to resolve closely-spaced tones is dependent on the design and order of the baseband filter.

Figure 14:
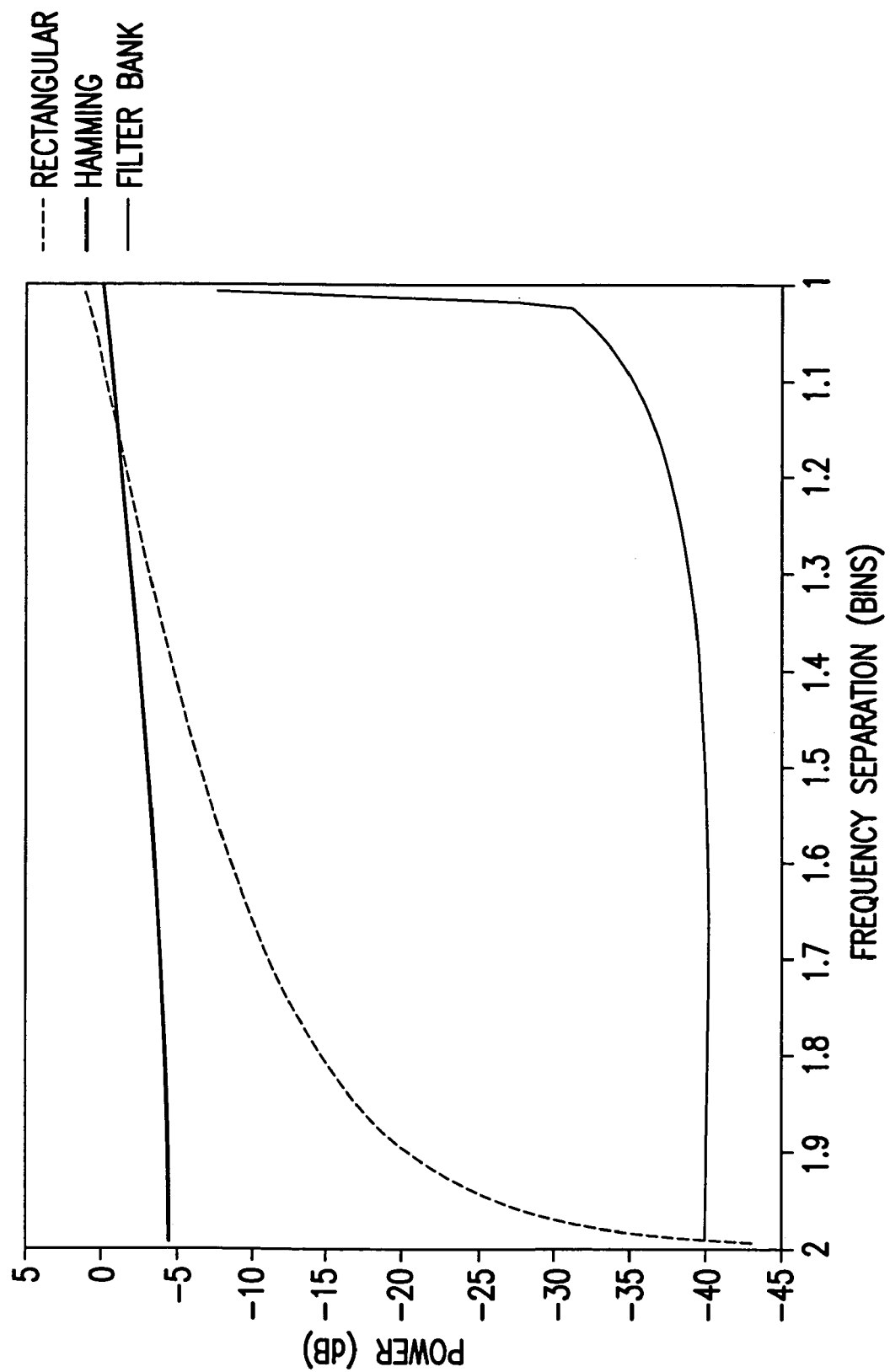
FIG. 14 is a graph illustrating the ratio of out-of-bin power to in-bin power for two tonal frequencies for three types of spectral analyses.

To further evaluate the frequency resolution, the above experiment was repeated for a noise-free case and several frequency separations between 2.0 and 1.0 bins. The metric used for comparison was the ratio of out-of-bin power to in-bin power for bins 399 and 401. FIG. 14 shows a plot of this metric for the three methods of spectral analysis and illustrates the superiority of the filter-bank of the present invention, even for frequency separations just slightly larger than a single bin. Note that by this metric, the rectangular window outperforms the Hamming window DFT (except near the bin-edges) due to the fact that the rectangular window based filter has its passband edge closer to the ideal, π/M.

Although the invention has been described herein in conjunction with specific embodiments thereof, many alternatives, modifications and variations will be apparent to those skilled in the art. The present invention is intended to embrace all such alternatives, modifications, and variations that fall within the spirit and broad scope of the appended claims.

What is claimed is:

1. A system for spectral analysis comprising:
    filter bank means for filtering a plurality of decimated data sequences to provide a plurality of filtered data sequences, said filter bank means being constructed in accordance with a polyphase decomposition of a prototype filter, said prototype filter being of an order greater than a number of filters in said filter bank;
    decimation means for selecting a first number of samples from each of a plurality of input data sequences to provide said plurality of decimated data sequences, said first number of samples corresponding to a fractional number of said number of filters in said filter bank, said fractional number being a rational number less than or equal to unity, said decimation means further for selecting a second number of samples from each of said plurality of filtered data sequences; and transform means for computing a frequency distribution for each of said plurality of filtered data sequences.

2. The system for nonparametric spectral analysis as recited in claim 1, wherein said filter bank means includes input sequence delay means for forming a plurality of delayed input data sequences, each of said plurality of delayed input data sequences being provided to said decimation means as said plurality of input data sequences.

3. The system for nonparametric spectral analysis as recited in claim 1, wherein said prototype filter is a low-pass filter.

4. The system for nonparametric spectral analysis as recited in claim 3, wherein said prototype filter order is greater than said number of filters by at least a factor of one hundred.

5. The system for nonparametric spectral analysis as recited in claim 1, wherein said transform means includes means for performing an inverse Discrete Fourier Transform.

6. The system for spectral analysis as recited in claim 5, wherein each of said output channels includes a phase compensator.

7. A system for spectral analysis of discrete time-indexed data comprising:
   a tapped delay line for receiving at an input port thereof the time-indexed data and providing at each of a plurality of output ports thereof a corresponding delayed data sequence;
   a filter bank having a plurality of filter channels, each filter channel including:
      a first decimator coupled to a corresponding one of said output ports of said tapped delay line for producing a first decimated data sequence from a corresponding delayed data sequence;
      a filter coupled to said first decimator, said filter being of an order greater than a number of said plurality of filter channels; and,
      a second decimator coupled to said filter for producing a second decimated data sequence;
   a transform processor coupled to said filter bank for transforming the time-indexed data into frequency components thereof; and,
   a plurality of output channels, each of said channels producing at an output port thereof a time-indexed sequence corresponding one of said frequency components.

8. The system for spectral analysis as recited in claim 7, wherein said second decimated data sequence is the discrete time-indexed data decimated by a number equal to a rational fraction of the number of said plurality of filter channels.

9. The system for spectral analysis as recited in claim 7, wherein said transform processor executes an inverse Discrete Fourier Transform.

10. The system for spectral analysis as recited in claim 9, wherein each of said output channels includes a phase compensator.

11. The system for nonparametric spectral analysis as recited in claim 7, wherein said filter order is greater than said number of filters by at least a factor of ten.

12. The system for nonparametric spectral analysis as recited in claim 7, wherein said filter order is greater than said number of filters by at least a factor of one hundred.

13. A system for spectral analysis of discrete time-indexed input data comprising:
   a tapped delay line for receiving at an input port thereof the time-indexed input data and providing at each of a plurality of output ports thereof a corresponding delayed data sequence;
   a filter bank having a plurality of filter channels, each filter channel including:
      a first decimator coupled to a corresponding one of said output ports of said tapped delay line for producing a first decimated data sequence from a corresponding delayed data sequence; and,
      a filter coupled to said first decimator, said filter being of an order greater than a number of said plurality of filter channels;
   a transform processor coupled to said filter bank for transforming the time-indexed input data into frequency components thereof;
   a plurality of output channels, each of said channels producing at an output port thereof a time-indexed sequence corresponding one of said frequency components; and,
   a second decimator coupled to each of the plurality of output channels for decimating said time-indexed sequence corresponding one of said frequency components to produce a decimated frequency sequence.

14. The system for spectral analysis as recited in claim 13, wherein said decimated frequency sequence corresponds to a frequency component of the discrete time-indexed input data decimated by a number equal to a rational fraction of the number of said plurality of filter channels.

15. The system for spectral analysis as recited in claim 13, wherein said transform processor executes an inverse Discrete Fourier Transform.

16. The system for spectral analysis as recited in claim 15, wherein each of said output channels includes a phase compensator respectively coupled to a corresponding said second decimator.

17. The system for nonparametric spectral analysis as recited in claim 13, wherein said filter order is greater than said number of filters by at least a factor of ten.

18. The system for nonparametric spectral analysis as recited in claim 13, wherein said filter order is greater than said number of filters by at least a factor of one hundred.

19. A system for spectral analysis comprising:
   filter bank means for filtering a plurality of decimated data sequences to provide a plurality of filtered data sequences, said filter bank means being constructed in accordance with a polyphase decomposition of a prototype filter, said prototype filter being of an order greater by a factor of greater than ten than a number of filters in said filter bank;
   decimation means for selecting a reduced number of samples from each of a plurality of input data sequences to provide said plurality of decimated data sequences, said number of samples corresponding to a fractional number of said number of filters in said filter bank, said fractional number being a rational number less than or equal to unity; and
   transform means for computing a frequency distribution for each of said plurality of filtered data sequences.

20. The system for spectral analysis as recited in claim 19, wherein said prototype filter is of an order greater by a factor of greater than one hundred than said number of filters in said filter bank.

* * * * *